(12) United States Patent
Haymore et al.

(10) Patent No.: US 12,716,713 B2
(45) Date of Patent: Aug. 25, 2026

(54) IN-SITU WAFER STRESS MEASUREMENT BY CHROMATIC CONFOCAL SENSOR SCANNING WITH TEMPERATURE COMPENSATION

(71) Applicant: Orbotech Ltd., Yavne (IL)

(72) Inventors: Scott Haymore, Newport (GB); Arkady Bronfman, Beer Sheva (IL); Tal Goichman, Kiryat Ono (IL); Tony Wilby, Bristol (GB); Boaz Rosenberg, Gadera (IL)

(73) Assignee: Orbotech Ltd., Yavne (IL)

( * ) Notice: Subject to any disclaimer, the term of this patent is extended or adjusted under 35 U.S.C. 154(b) by 85 days.

(21) Appl. No.: 18/957,421

(22) Filed: Nov. 22, 2024

(65) Prior Publication Data

US 2025/0354801 A1 Nov. 20, 2025

Related U.S. Application Data

(60) Provisional application No. 63/648,690, filed on May 17, 2024.

(51) Int. Cl.
*G01B 11/24* (2006.01)
*G01B 11/16* (2006.01)
(Continued)

(52) U.S. Cl.
CPC .............. *G01B 11/24* (2013.01); *G01B 11/16* (2013.01); *G01J 5/10* (2013.01); *H10P 72/0602* (2026.01);
(Continued)

(58) Field of Classification Search
CPC .... G01B 11/24; G01B 11/16; G01B 2210/56; G01J 5/10; G01J 5/0007; H10P 72/0602;
(Continued)

(56) References Cited

U.S. PATENT DOCUMENTS 8,225,683 B2 7/2012 Bailey, III
8,654,324 B2 2/2014 Gastaldo
(Continued)

FOREIGN PATENT DOCUMENTS

CN 109959338 A * 7/2019 ............. G01B 11/06
DE 102022118320 A1 * 1/2023 ........... G01B 21/045
(Continued)

OTHER PUBLICATIONS

Ma et al., "Applications of Chromatic Confocal Technology in Precision Geometric Measurement of Workpieces," International Symposium on Advanced Launch Technologies (ISALT 2022), 2023, vol. 2460.
(Continued)

*Primary Examiner* — Michael P LaPage
(74) *Attorney, Agent, or Firm* — Hodgson Russ LLP

(57) ABSTRACT

A system includes a process chamber, a transport chamber connected to the process chamber, a robot arm that supports a workpiece, a chromatic confocal sensor, a temperature sensor, and a processor. The robot arm is configured to move the workpiece along a movement path between the process chamber and the transport chamber, and as the robot arm moves the workpiece along the movement path, the chromatic confocal sensor is configured to measure a wavelength of light reflected by the workpiece and the temperature sensor is configured to measure a surface temperature of the workpiece. The processor is configured to filter a first scanning signal received from the chromatic confocal sensor to produce a first filtered signal that compensates for temperature variations of the workpiece according to a first temperature signal received from the temperature sensor, and generate a first bow profile of the workpiece based on the first filtered signal.

18 Claims, 14 Drawing Sheets

(51) Int. Cl.
*G01J 5/10* (2006.01)
*H10P 72/00* (2026.01)
*H10P 72/76* (2026.01)

(52) U.S. Cl.
CPC ...... *H10P 72/0616* (2026.01); *H10P 72/7602* (2026.01); *G01B 2210/56* (2013.01); *H10P 72/0454* (2026.01)

(58) Field of Classification Search
CPC ............. H10P 72/0616; H10P 72/7602; H10P 72/0454; H10P 72/3302; H10P 72/53; H10P 72/0466; H10P 72/0604
See application file for complete search history.

(56) References Cited

U.S. PATENT DOCUMENTS 9,494,529 B1 11/2016 Fresquet et al.
9,541,376 B2 1/2017 Kubo
2007/0148792 A1* 6/2007 Marx .................... H10P 74/203 257/E21.53
2007/0196011 A1 8/2007 Cox et al.
2009/0088887 A1 4/2009 Chen et al.
2012/0283865 A1 11/2012 Bailey, III
2018/0113292 A1 4/2018 Novikau et al.
2018/0116512 A1* 5/2018 Bitoun ................... A61B 3/165
2018/0272490 A1* 9/2018 Brenner .................. F16F 7/082
2021/0199496 A1* 7/2021 Kiesel ....................... G01J 3/14
2022/0074869 A1 3/2022 Arora et al.
2024/0094144 A1 3/2024 Arora et al.
2025/0028294 A1* 1/2025 Pandey .............. G05B 23/0297
2025/0069959 A1 2/2025 Kulkarni

FOREIGN PATENT DOCUMENTS

JP 2022043556 3/2022
WO 2008069513 A1 6/2008
WO 2024025739 A1 2/2024
WO 2024044274 A1 2/2024

OTHER PUBLICATIONS

WIPO, International Search Report issued in international patent application No. PCT/IB2025/054936, date of mailing: Aug. 4, 2025.

* cited by examiner

IN-SITU WAFER STRESS MEASUREMENT BY CHROMATIC CONFOCAL SENSOR SCANNING WITH TEMPERATURE COMPENSATION

CROSS-REFERENCE TO RELATED APPLICATIONS

This application claims priority to the provisional patent application filed May 17, 2024, and assigned U.S. App. No. 63/648,690, the entire disclosure of which is hereby incorporated by reference.

FIELD OF THE DISCLOSURE

This disclosure relates to semiconductor manufacturing and, more particularly, to wafer stress measurements between thin film deposition processes.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a workpiece, such as a semiconductor wafer, using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

Stress is often a critical property for thin film deposition processes, such as physical vapor deposition (PVD) and chemical vapor deposition (CVD), and achieving precise stress control is key to process control. Various metrology processes can measure the bow profile of a wafer, which can be used to determine wafer stress. However, existing processes are performed ex-situ, which requires taking the wafer out of the tool (and vacuum environment) and performing off-line measurements to correct process parameters. This slows down the production rate, causes contamination and negatively affects the yield. Specific ex-situ process each have their own drawbacks. For example, triangulation measurements are sensitive to surface optical parameters, angles of incidence, and reflectivity, one shot profiling systems have low lateral resolution for fast profiling, interferometry is slow and sensitive to surface optical properties, non-optical sensors have low XY resolution, averaging the height by a large working "spot," and have a small working distance, and physical contact techniques as slow and more suitable for surface roughness profiling rather than general wafer bow measurements.

Therefore, what is needed is an improved method for wafer stress measurement.

BRIEF SUMMARY OF THE DISCLOSURE

An embodiment of the present disclosure provides a system. The system may comprise a process chamber and a transport chamber connected to the process chamber via a slot valve. The slot valve may be operable between an open position, in which the transport chamber is in fluid communication with the process chamber, and a closed position, in which the process chamber is sealed from the transport chamber. The system may further comprise a robot arm. The robot arm may be configured to support a workpiece and move the workpiece along a movement path between the process chamber and the transport chamber with the slot valve in the open position. The system may further comprise a chromatic confocal sensor. The chromatic confocal sensor may be configured to measure a wavelength of light reflected by the workpiece as the robot arm moves the workpiece along the movement path. The system may further comprise a temperature sensor. The temperature sensor may be configured to measure a surface temperature of the workpiece as the robot arm moves the workpiece along the movement path between the process chamber and the transport chamber. The system may further comprise a processor. The processor may be in electronic communication with the chromatic confocal sensor and the temperature sensor. The processor may be configured to receive a first scanning signal from the chromatic confocal sensor based on the wavelength of the light reflected by the workpiece as the robot arm moves the workpiece from the transport chamber to the process chamber. The processor may be further configured to receive a first temperature signal from the temperature sensor based on the surface temperature of the workpiece measured by the temperature sensor as the robot arm moves the workpiece from the transport chamber to the process chamber. The processor may be further configured to filter the first scanning signal to produce a first filtered signal that compensates for temperature variations of the workpiece according to the first temperature signal. The processor may be further configured to generate a first bow profile of the workpiece based on the first filtered signal.

In some embodiments, the processor may be further configured to receive a second scanning signal from the chromatic confocal sensor based on the wavelength of the light reflected by the workpiece as the robot arm moves the workpiece from the process chamber to the transport chamber. The processor may be further configured to receive a second temperature signal from the temperature sensor based on the surface temperature of the workpiece measured by the temperature sensor as the robot arm moves the workpiece from the process chamber to the transport chamber. The processor may be further configured to filter the second scanning signal to produce a second filtered signal that compensates for temperature variations of the workpiece according to the second temperature signal. The processor may be further configured to generate a second bow profile of the workpiece based on the second filtered signal. The processor may be further configured to generate a stress profile of the workpiece based on the first bow profile and the second bow profile.

In some embodiments, the chromatic confocal sensor may be configured to emit polychromatic light across a surface of the workpiece as the robot arm moves the workpiece along the movement path. The chromatic confocal sensor may be further configured to detect the wavelength of the light reflected by the workpiece.

In some embodiments, the chromatic confocal sensor may be disposed outside of the slot valve at atmospheric pressure. The chromatic confocal sensor may be configured to emit the polychromatic light through a window of the slot valve across the surface of the workpiece as the robot arm moves the workpiece along the movement path.

In some embodiments, the system may further comprise a vacuum pump. The vacuum pump may be in fluid communication with the process chamber and the transport chamber. The vacuum pump may be configured to produce a vacuum pressure in the process chamber and the transport chamber.

In some embodiments, the system may further comprise a chuck disposed in the process chamber. The robot arm may be configured to removably dispose the workpiece on the chuck. The system may further comprise a deposition tool disposed in the process chamber. The deposition tool may be configured to deposit a film layer on a surface of the workpiece disposed on the chuck with the slot valve in the closed position.

In some embodiments, the system may further comprise a plurality of process chambers. The transport chamber may be connected to each of the plurality of process chambers by a respective slot valve, and the robot arm may be configured to move the workpiece along a movement path between each of the plurality of process chambers and the transport chamber with the respective slot valve in the open position. The system may further comprise a plurality of chromatic confocal sensors. Each of the plurality of chromatic confocal sensors may be configured to measure a wavelength of light reflected by the workpiece as the robot arm moves the workpiece along the movement path between the plurality of process chambers and the transport chamber. The system may further comprise a plurality of temperature sensors. Each of the plurality of temperature sensors may be configured to measure a surface temperature of the workpiece as the robot arm moves the workpiece along the movement path between the plurality of process chambers and the transport chamber. The processor may be further configured to receive a plurality of first scanning signals from the plurality of the chromatic confocal sensors based on the wavelength of the light reflected by the workpiece as the robot arm moves the workpiece from the transport chamber to each respective one of the plurality of process chambers. The processor may be further configured to receive a plurality of first temperature signals from the plurality of temperature sensors based on the surface temperature of the workpiece measured by each of the plurality of temperature sensor as the robot arm moves the workpiece from the transport chamber to each respective one of the plurality of process chambers. The processor may be further configured to filter the plurality of first scanning signals to produce a plurality of first filtered signals that compensate for temperature variations of the workpiece according to the respective one of the plurality of first temperature signals. The processor may be further configured to generate a plurality of first bow profiles of the workpiece based on the plurality of first filtered signals.

In some embodiments, the plurality of process chambers may be clustered around the transport chamber. The movement path of the robot arm from the transport chamber to each of the plurality of process chambers may be in a different radial direction relative to the transport chamber.

In some embodiments, the temperature sensor may be a pyrometer configured to emit infrared light across a surface of the workpiece as the robot arm moves the workpiece along the movement path and detect an intensity of the light reflected by the workpiece to measure the surface temperature of the workpiece.

In some embodiments, the pyrometer may be disposed outside of the slot valve at atmospheric pressure and may be configured to emit the infrared light through a window of the slot valve across the surface of the workpiece as the robot arm moves the workpiece along the movement path.

In some embodiments, the system may further comprise an equipment front end module (EFEM) connected to the transport chamber and a rotary stage disposed within the EFEM. The robot arm may be configured to removably dispose the workpiece on the rotary stage. The rotary stage may be configured to rotate the workpiece to a different rotary alignment with the workpiece disposed on the rotary stage. The robot arm may be further configured to move the workpiece along the movement path between the process chamber and the transport chamber from the EFEM, with a rotary alignment of the workpiece being set by the rotary stage.

In some embodiments, the processor may be further configured to generate the first bow profile of the workpiece based on the first scanning signal received from the chromatic confocal sensor based on the light reflected by the workpiece in each different rotary alignment.

In some embodiments, chromatic confocal sensor may be configured to emit polychromatic light in a line across a surface of the workpiece as the robot arm moves the workpiece along the movement path. A width of the line may be greater than or equal to a width of the workpiece.

In some embodiments, the system may further comprise an electronic data storage unit in electronic communication with the processor. A convolutional neural network (CNN) model may be stored on the electronic data storage unit. The processor may be configured to filter the first scanning signal to produce the first filtered signal that compensates for temperature variations of the workpiece according to the first temperature signal using the CNN model.

In some embodiments, the CNN model may be configured to output correction parameters, which, when applied to a polynomial fitting of the first scanning signal, may compensate for temperature variations of the workpiece according to the first temperature signal to produce the first filtered signal.

Another embodiment of the present disclosure provides a method. The method may comprise moving, with a robot arm, a workpiece along a movement path from a transport chamber to a process chamber. The transport chamber may be connected to the process chamber via a slot valve, the slot valve may be operable between an open position, in which the transport chamber is in fluid communication with the process chamber, and a closed position, in which the process chamber is sealed from the transport chamber, and the slot valve may be in the open position as the robot arm moves the workpiece along the movement path. The method may further comprise measuring, with a chromatic confocal sensor, a wavelength of light reflected by the workpiece as the robot arm moves the workpiece from the transport chamber to the process chamber. The method may further comprise measuring, with a temperature sensor, a surface temperature of the workpiece as the robot moves the workpiece from the transport chamber to the process chamber. The method may further comprise receiving, with a processor, a first scanning signal from the chromatic confocal sensor based on the wavelength of the light reflected by the workpiece as the robot arm moves the workpiece from the transport chamber to the process chamber. The method may further comprise receiving, with the processor, a first temperature signal from the temperature sensor based on the surface temperature of the workpiece measured by the temperature sensor as the robot arm moves the workpiece from the transport chamber to the process chamber. The method may further comprise filtering, with the processor, the first scanning signal to produce a first filtered signal that compensates for temperature variations of the workpiece according to the first temperature signal. The method may further comprise generating, with the processor, a first bow profile of the workpiece based on the first filtered signal.

In some embodiments, the method may further comprise moving, with the robot arm, the workpiece along the movement path from the process chamber to the transport chamber. The method may further comprise measuring, with a chromatic confocal sensor, a wavelength of light reflected by the workpiece as the robot arm moves the workpiece from the process chamber to the transport chamber. The method may further comprise measuring, with a temperature sensor, a surface temperature of the workpiece as the robot moves the workpiece from the process chamber to the transport chamber. The method may further comprise receiving, with the processor, a second scanning signal from the chromatic confocal sensor based on the wavelength of the light reflected by the workpiece as the robot arm moves the workpiece from the process chamber to the transport chamber. The method may further comprise receiving, with the processor, a second temperature signal from the temperature sensor based on the surface temperature of the workpiece measured by the temperature sensor as the robot arm moves the workpiece from the process chamber to the transport chamber. The method may further comprise filtering, with the processor, the second scanning signal to produce a second filtered signal that compensates for temperature variations of the workpiece according to the second temperature signal. The method may further comprise generating, with the processor, a second bow profile of the workpiece based on the second filtered signal. The method may further comprise generating, with the processor, a stress profile of the workpiece based on the first bow profile and the second bow profile.

In some embodiments, the method may further comprise producing, with a vacuum pump, a vacuum pressure in the process chamber and the transport chamber with the slot valve in the open position. The method may further comprise depositing, with a deposition tool, a film layer on the surface of the workpiece with the slot valve in the closed position, wherein the deposition tool is disposed in the process chamber.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1:
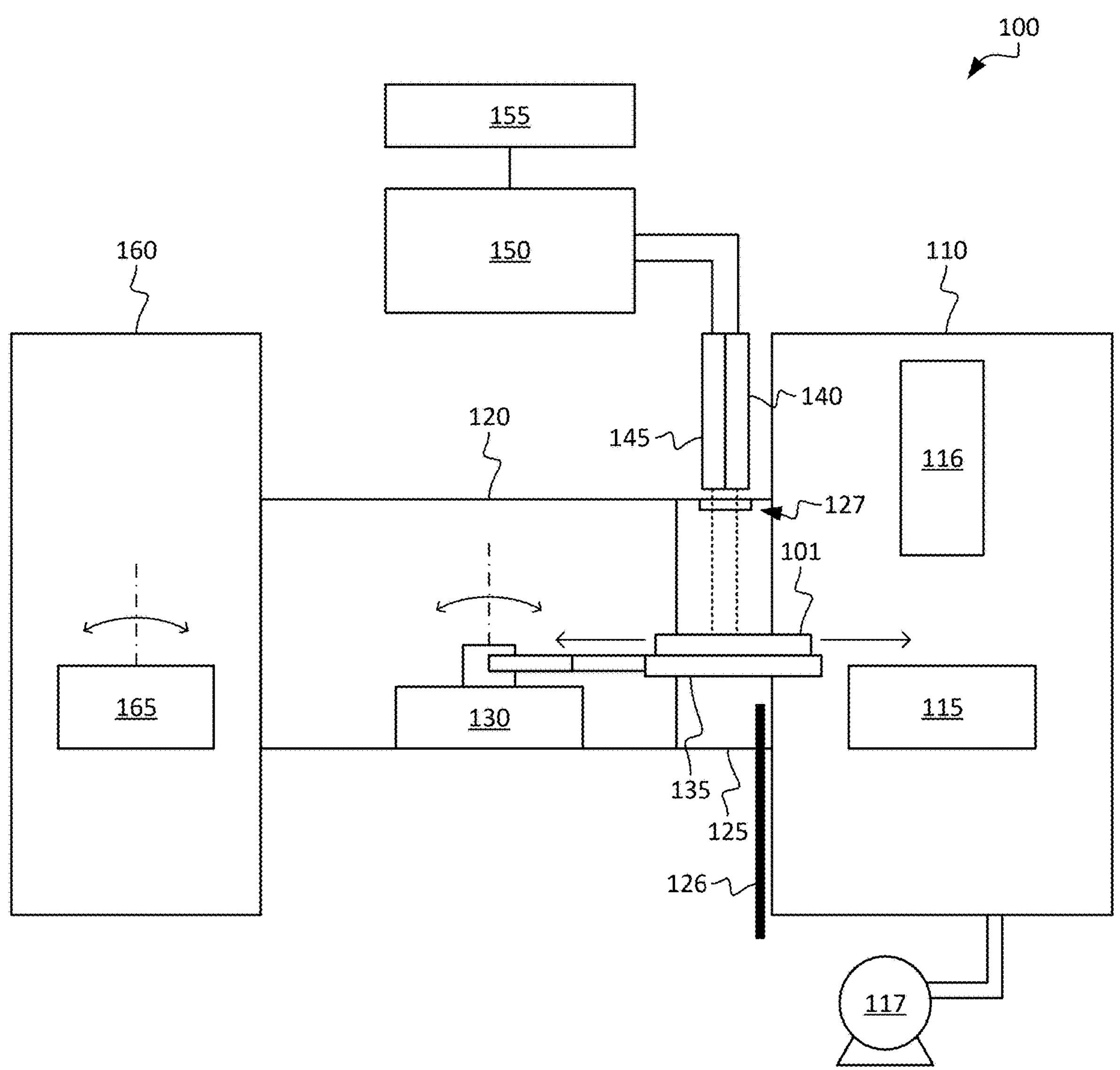
FIG. 1 is a side view of a system according to an embodiment of the present disclosure, in which a workpiece is being transported between a transport chamber and a process chamber by a robot arm with a slot valve in an open position.
Figure 2:
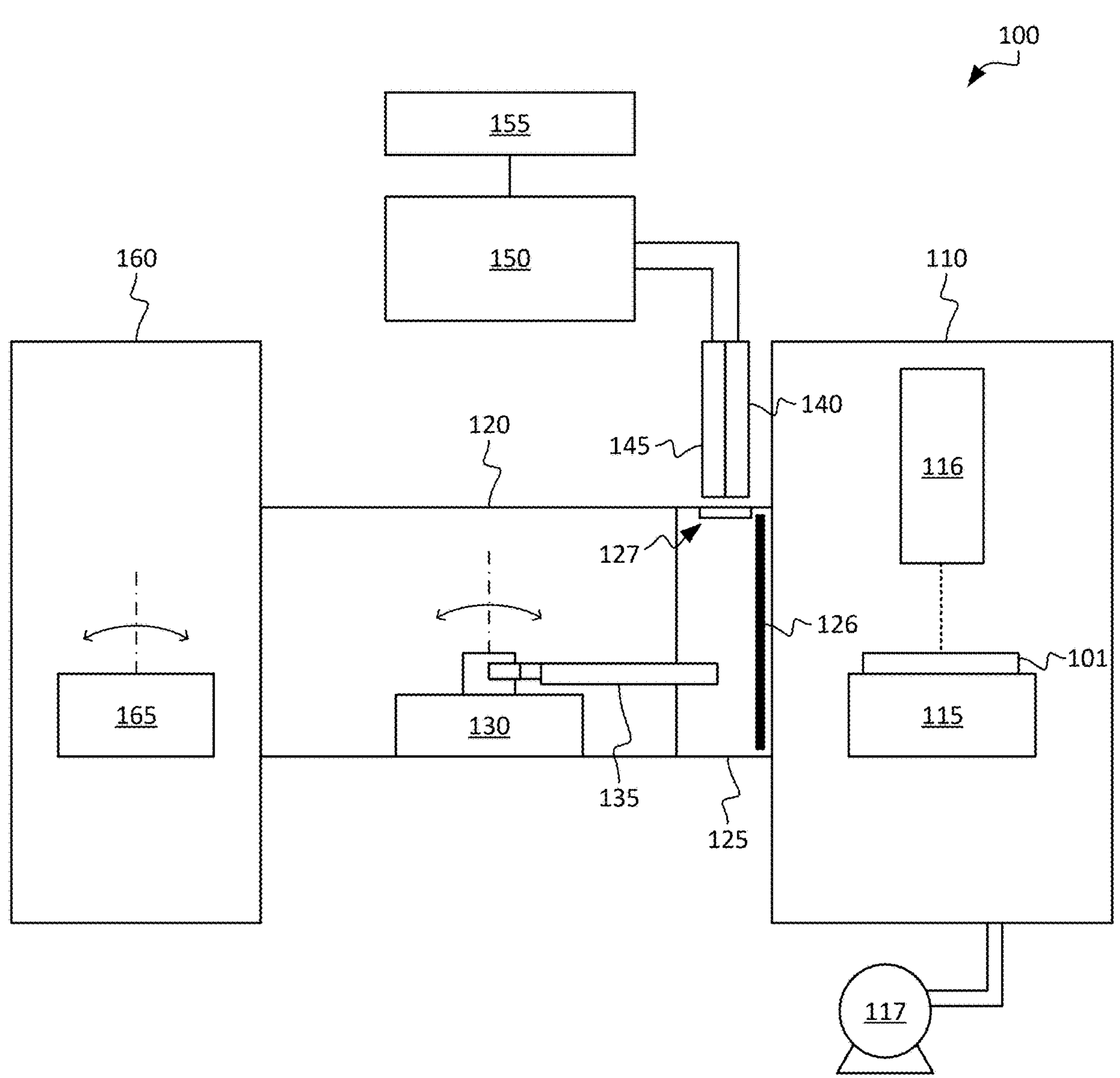
FIG. 2 a side view of the system of FIG. 1, in which the workpiece is disposed on a chuck within the process chamber with the slot valve in a closed position.
Figure 3:
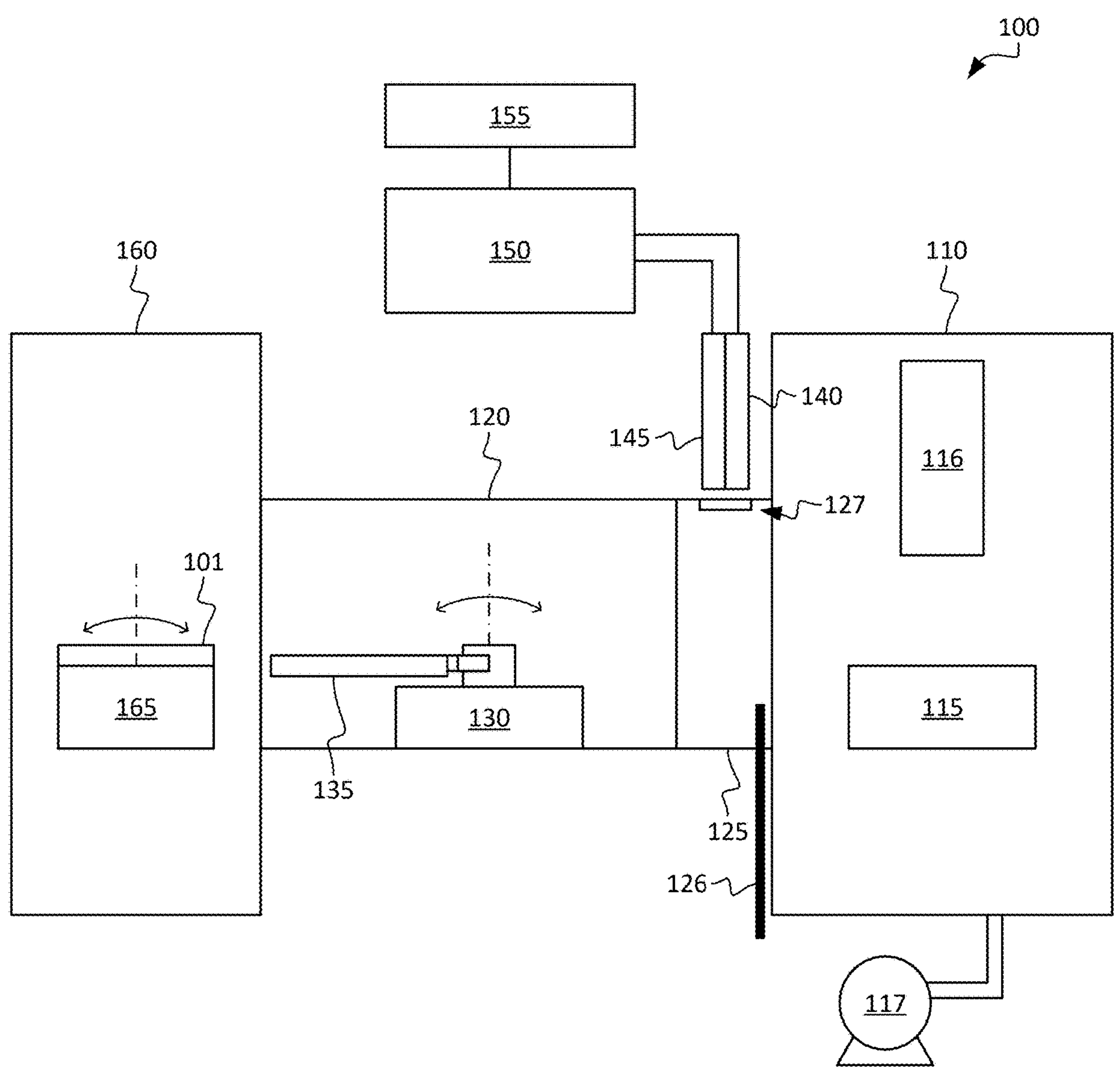
FIG. 3 is a side view of the system of FIG. 1, in which the workpiece is disposed on a rotary stage within an equipment front end module (EFEM), transported by the robot arm from the transport chamber.

An embodiment of the present disclosure provides a system 100, as shown in FIGS. 1-3. The system 100 may be configured for inspection and/or fabrication of a workpiece 101. The workpiece 101 may be, for example, a semiconductor wafer, substrate, printed circuit board (PCB), flat panel display (FPD), integrated circuit (IC), or other type of workpiece. The system 100 may be configured to perform one or more fabrication, inspection, metrology, or review processes on the workpiece 101. In some embodiments, the system 100 may be configured to perform one or more fabrication, inspection, metrology, or review processes on a plurality of workpiece 101 simultaneously or in parallel.

The system 100 may comprise a process chamber 110. The system 100 may further comprise a chuck 115. The chuck 115 may be disposed within the process chamber 110. The chuck 115 may be configured to support the workpiece 101 (as shown in FIG. 2). The system 100 may further comprise a deposition tool 116. The deposition tool 116 may be disposed on the process chamber 110. The deposition tool 116 may be configured to deposit a film layer on a surface of the workpiece 101 disposed on the chuck 115. For example, the deposition tool 116 may use physical vapor deposition (PVD) or chemical vapor deposition (CVD) to deposit the film layer on the surface of the workpiece 101. In some embodiments, an etching tool may be disposed in the process chamber 110 in place of the deposition tool 116. The etching tool may be configured to etch (chemically or mechanically) the surface of the workpiece 101 disposed on the chuck 115. The system 100 may further comprise a vacuum pump 117. The vacuum pump may be in fluid communication with the process chamber 110. The vacuum pump 117 may be configured to produce a vacuum pressure in the process chamber 110. The vacuum pressure produced by the vacuum pump 117 may depend on the processes performed in the process chamber 110 and the type of the deposition tool 116 (or etching tool or other type of tool). In some embodiments, the vacuum pressure may be high vacuum pressure ($1\times10^{-3}$ to $1\times10^{-9}$ Torr) or ultra-high vacuum pressure ($1\times10^{-9}$ to $1\times10^{-12}$ Torr).

The system 100 may further comprise a transport chamber 120. The transport chamber 120 may be connected to the process chamber 110 via a slot valve 125. The slot valve 125 may include a gate 126 that may be operable between an open position and a closed position. In the open position (as shown in FIG. 1), the transport chamber 120 may be in fluid communication with the process chamber 110. In the closed position (as shown in FIG. 2), the process chamber 110 may be sealed from the transport chamber 120. The slot valve 125 may be in the closed position when the workpiece 101 is disposed on the chuck 115 in the process chamber 110 and the deposition tool 116 is depositing a film layer on the surface of the workpiece 101 (or the etching tool is etching the surface of the workpiece 101). With the slot valve 125 in the open position, the vacuum pump 117 may be configured to produce a vacuum pressure in the process chamber 110 and the transport chamber 120.

The system 100 may further comprise a robot arm 130. The robot arm 130 may include an end effector 135 configured to support the workpiece 101. The robot arm 130 may be configured to move the workpiece 101 along a movement path between the process chamber 110 and the transport chamber 120 with the slot valve 125 in the open position (as shown in FIG. 1). For example, the robot arm 130 may be configured to extend and retract to move the workpiece 101 along the movement path between the process chamber 110 and the transport chamber 120. The robot arm 130 may be further configured to rotate to move the workpiece 101 within the transport chamber 120 and to align the workpiece 101 with the slot valve 125 to be moved from the transport chamber 120 to the process chamber 110. The robot arm 130 may be further configured to dispose the workpiece 101 on the chuck 115 and remove the workpiece 101 from the chuck 115.

The system 100 may further comprise a chromatic confocal sensor 140. The chromatic confocal sensor 140 may be configured to measure a wavelength of light reflected by the workpiece 101 as the robot arm 130 moves the workpiece 101 along the movement path. For example, the chromatic confocal sensor 140 may be configured to emit polychromatic light across a surface of the workpiece 101 as the robot arm 130 moves the workpiece 101 along the movement path to detect the wavelength of the light reflected by the workpiece 101. In some embodiments, the chromatic confocal sensor 140 may be configured to emit the polychromatic light in a line across the surface of the workpiece 101 as the robot arm 130 moves the workpiece 101 along the movement path. In some embodiments, a width of the line may be greater than or equal to a width of the workpiece 101. Accordingly, the chromatic confocal sensor 140 may be configured to measure the entire surface of the workpiece 101 as the workpiece is scanned past the chromatic confocal sensor 140. In some embodiments, the chromatic confocal sensor 140 may be disposed outside of the slot valve 125 at atmospheric pressure. The chromatic confocal sensor 140 may be configured to emit the polychromatic light through a window 127 of the slot valve 125 across the surface of the workpiece 101 as the robot arm 130 moves the workpiece 101 along the movement path. With the chromatic confocal sensor 140 disposed at atmosphere, outside of the transport chamber 120 and the process chamber 110, the chromatic confocal sensor 140 may be configured for sensing in a clean manner, without risk of contamination to the workpiece 101 due to feedthroughs inside the clean vacuum environment. In some embodiments, the slot valve 125 may be modified to include the window 127. In some embodiments, the slot valve 125 may be provided in an interface block between the transport chamber 120 and the process chamber 110 adjacent to the slot valve 125. The window 127 may be made of a transparent material such as transparent soda lime glass.

The system 100 may further comprise a processor 150. The processor 150 may include a microprocessor, a microcontroller, or other devices. The processor 150 may be coupled to the components of the system 100 in any suitable manner (e.g., via one or more transmission media, which may include wired and/or wireless transmission media) such that the processor 150 can receive output. The processor 150 may be configured to perform a number of functions using the output. An inspection tool can receive instructions or other information from the processor 150. The processor 150 optionally may be in electronic communication with another inspection tool, a metrology tool, a repair tool, or a review tool (not illustrated) to receive additional information or send instructions.

The processor 150 may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 150 may be disposed in or otherwise part of the system 100 or another device. In an example, the processor 150 may be part of a standalone control unit or in a centralized quality control unit. Multiple processors 150 may be used, defining multiple subsystems of the system 100.

The processor 150 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 150 to implement various methods and functions may be stored in readable storage media, such as a memory.

If the system 100 includes more than one subsystem, then the different processors 150 may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 150 may be configured to perform a number of functions using the output of the system 100 or other output. For instance, the processor 150 may be configured to send the output to an electronic data storage unit or another storage medium. The processor 150 may be further configured as described herein.

The processor 150 may be configured according to any of the embodiments described herein. The processor 150 also may be configured to perform other functions or additional steps using the output of the system 100 or using images or data from other sources.

The processor 150 may be communicatively coupled to any of the various components or sub-systems of system 100 in any manner known in the art. Moreover, the processor 150 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 150 and other subsystems of the system 100 or systems external to system 100. Various steps, functions, and/or operations of system 100 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random-access memory, a magnetic or optical disk, a non-volatile memory, a solid-state memory, a magnetic tape, and the like. A carrier medium may include a transmission medium such as a wire, cable, or wireless transmission link. For instance, the various steps described throughout the present disclosure may be carried out by a single processor 150 (or computer subsystem) or, alternatively, multiple processors 150 (or multiple computer subsystems). Moreover, different sub-systems of the system 100 may include one or more computing or logic systems. Therefore, the above description should not be interpreted as a limitation on the present disclosure but merely an illustration.

The processor 150 may be in electronic communication with the deposition tool 116 (or etching tool or other type of tool) disposed in the process chamber 110. For example, the processor 150 may be configured to send instructions to the deposition tool 116 (or etching tool or other type of tool) to deposit a film layer on the surface of the workpiece 101 disposed on the chuck 115 in the process chamber 110.

The processor 150 may be in electronic communication with the vacuum pump 117. For example, the processor 150 may be configured to control the vacuum pump 117 to produce the vacuum pressure in the process chamber 110.

The processor 150 may be in electronic communication with the slot valve 125. For example, the processor 150 may be configured to control the slot valve 125 to move the gate 126 between the open position and the closed position.

The processor 150 may be in electronic communication with the robot arm 130. For example, the processor 150 may be configured to send instructions to the robot arm 130 to move the workpiece 101 along the movement path between the process chamber 110 and the transport chamber 120. The instructions may include, for example, extensions, retractions, and/or rotations of the robot arm 130 to move the end effector 135 supporting the workpiece 101 between the process chamber 110 and the transport chamber 120. The processor 150 may be further configured to send instructions to the robot arm 130 to dispose the workpiece 101 on the chuck 115 in the process chamber 110 and remove the workpiece 101 from the chuck 115.

The processor 150 may be in electronic communication with the chromatic confocal sensor 140. For example, the processor 150 may be configured to control the chromatic confocal sensor 140 to emit polychromatic light across the surface of the workpiece 101 as the robot arm 130 moves the workpiece 101 between the transport chamber 120 and the process chamber 110. The processor 150 may be further configured to receive a first scanning signal from the chromatic confocal sensor 140 based on the wavelength of the light reflected by the workpiece 101 as the robot arm 130 moves the workpiece 101 from the transport chamber 120 to the process chamber 110. The first scanning signal may be a continuous signal defined by a plurality of measurements taken by the chromatic confocal sensor 140 as the polychromatic light is scanned across the surface of the workpiece 101. The number of measurements may depend on the shutter speed of the chromatic confocal sensor 140. In general, a higher number of measurements may correspond to higher resolution or more accurate measurements of the surface of the workpiece 101.

As the robot arm 130 moves the workpiece 101 along the movement path between the process chamber 110 and the transport chamber 120, the end effector 135 may vibrate at an amplitude of in a range of 100s of μm. The vibration pattern may vary in amplitude depending on a degree of extension or retraction of the robot arm 130 and/or a speed or acceleration of the movement of the robot arm 130. Accordingly, the vibrations may induce noise in the first scanning signal received from the chromatic confocal sensor 140, which may produce error in calculation of the first bow profile. The processor 150 may be further configured to filter the first scanning signal to produce a first filtered signal that compensates for vibrations of the robot arm 130 while the robot arm 130 moves the workpiece 101 from the transport chamber 120 to the process chamber 110. The processor 150 may be further configured to generate a first bow profile of the workpiece based on the first filtered signal.

The system 100 may further comprise an electronic data storage unit 155. The electronic data storage unit may be in electronic communication with the processor 150. A convolutional neural network (CNN) model may be stored on the electronic data storage unit 155. The processor 150 may be configured to filter the first scanning signal to produce the first filtered signal that compensates for vibrations of the robot arm 130 while the robot arm 130 moves the workpiece 101 along the movement path using the CNN model. For example, the CNN model may be configured to output correction parameters, which, when applied to a polynomial fitting of the first scanning signal, may compensate for vibrations of the robot arm 130 while the robot arm 130 moves the workpiece 101 from the transport chamber 120 to the process chamber 110 to produce the first filtered signal. The CNN model may be trained using polynomial fitting of static bow profile measurements and affects on the bow profile due to vibration noise to associate correction parameters to compensate for the vibrations. The processor 150 may filter the first scanning signal to produce the first filtered signal by applying the correction parameters to the first scanning signal.

The processor 150 may be further configured to receive a second scanning signal from the chromatic confocal sensor 140 based on the wavelength of the light reflected by the workpiece 101 as the robot arm 130 moves the workpiece 101 from the process chamber 110 to the transport chamber 120. Similar to the first scanning signal, the second scanning signal may also have noise due to vibrations of the robot arm 130 when moving the workpiece 101 from the process chamber 110 to the transport chamber. The processor 150 may be further configured to filter the second scanning signal to produce a second filtered signal that compensates for vibrations of the robot arm 130 while the robot arm 130 moves the workpiece 101 from the process chamber 110 to the transport chamber 120. Similar to the first filtered signal, the processor 150 may be configured to filter the second scanning signal to compensate for vibrations of the robot arm 130 while the robot arm 130 moves the workpiece along the movement path using the CNN model. For example, the CNN model may output correction parameters which, when applied to a polynomial fitting of the second scanning signal, may compensate for vibrations of the robot arm 130 moves the workpiece 101 from the process chamber 110 to the transport chamber 120 to produce the second filtered signal. The processor 150 may be further configured to generate a second bow profile of the workpiece 101 based on the second filtered signal.

The processor 150 may be further configured to generate a stress profile of the workpiece 101 based on the first bow profile and the second bow profile. For example, the processor 150 may use the following formula to generate the stress profile:

$$\sigma = \frac{E_s h_s^2}{6(1-v_s)h}\left(\frac{1}{R} - \frac{1}{R_0}\right)$$

where $\sigma$ is stress, $E_s$ is Young's Modulus, $h_s$ is a thickness of the workpiece 101, h is a thickness of the film layer deposited on the surface of the workpiece 101, $R_0$ is an initial radius of curvature of the workpiece 101 from the first bow profile, and R is a radius of curvature of the workpiece 101 from the second bow profile. Accordingly, the system 100 may be configured to measure the stress profile of the workpiece 101 before and after each processing step performed in the process chamber 110 in-situ, while the workpiece 101 is handled with the robot arm 130. In some embodiments, the stress profile of the workpiece 101 may be a 2D contour map or a 3D surface plot indicating the stress across the surface of the workpiece 101.

The system 100 may further comprise an equipment front end module (EFEM) 160. The EFEM 160 may be connected to the transport chamber 120. The workpiece 101 may be loaded into the system 100 via the EFEM 160. For example, the workpiece 101 may be disposed on the end effector 135 of the robot arm 130 in the EFEM 160, and the robot arm 130 may be configured to move the workpiece 101 along a movement path between the EFEM 160 and the transport chamber 120. In some embodiments, a cassette of workpieces 101 may be loaded into the EFEM 160, and the end effector 135 of the robot arm 130 may be configured to remove one workpiece 101 from the cassette to move the workpiece 101 along a movement path between the EFEM 160 and the transport chamber 120. In this case, the EFEM 160 (or "cassette module") may be isolated from atmosphere by a door and from the transport chamber 120 by a slot valve (not shown) that only opens after the full cassette is at vacuum. In some embodiments, the workpiece 101 may be loaded into the EFEM 160 from a front opening unified pod (FOUP). In this case, the workpiece 101 may be handled into a load lock, which has a slot valve at the atmospheric side and another slot valve at the vacuum side, such that a single workpiece 101 can be pumped down to vacuum and the vacuum side slot valve opens to the transport chamber 120 for the end effector 135 of the robot arm 130 may be configured to move the workpiece 101 along a movement path between the EFEM 160 and the transport chamber 120.

The system 100 may further comprise a rotary stage 165. The rotary stage 165 may be disposed in the EFEM 160. The rotary stage 165 may be configured to support the workpiece 101. For example, the robot arm 130 may be configured removably dispose the workpiece 101 on the rotary stage 165. The rotary stage 165 may be configured to rotate the workpiece 101 to different rotary alignments. Accordingly, the robot arm 130 may be configured to remove the workpiece 101 from the rotary stage 165 and move the workpiece 101 along the movement path between the process chamber 110 and the transport chamber 120 from the EFEM 160, with the rotary alignment of the workpiece 101 being set by the rotary stage 165.

The processor 150 may be configured to generate the first bow profile and/or the second bow profile of the workpiece 101 based on the first scanning signal and the second scanning signal received from the chromatic confocal sensor 140 based on the light reflected by the workpiece 101 in each different rotary alignment. Accordingly, the stress profile of the workpiece 101 may be more accurately determined using scanning signals collected in different rotary alignments of the workpiece 101 relative to the chromatic confocal sensor 140.

The system 100 may further comprise a temperature sensor 145. The temperature sensor 145 may be configured to measure a surface temperature of the workpiece 101 as the robot arm 130 moves the workpiece 101 along the movement path between the process chamber 110 and the transport chamber 120. In some embodiments, the temperature sensor 145 may be a pyrometer configured to emit infrared light across a surface of the workpiece 101 as the robot arm 130 moves the workpiece 101 along the movement path and detect an intensity of the light reflected by the workpiece 101 to measure the surface temperature of the workpiece 101. In some embodiments, the pyrometer may be disposed outside of the slot valve 125 at atmospheric pressure and is configured to emit the infrared light through the window 127 of the slot valve 125 across the surface of the workpiece 101 as the robot arm 130 moves the workpiece 101 along the movement path. For example, the temperature sensor 145 may be disposed adjacent to the chromatic confocal sensor 140 for simultaneous measurements.

The processor 150 may be further configured to receive a first temperature signal from the temperature sensor 145 based on the surface temperature of the workpiece 101 measured by the temperature sensor 145 as the robot arm 130 moves the workpiece 101 from the transport chamber

120 to the process chamber 110. For example, the surface temperature of the workpiece 101 may impact bow profile measurements, which may, in turn, impact stress profile measurements. Since the surface temperature of the workpiece 101 may vary based on the ambient temperature of the transport chamber 120 and the process chamber 110 and the heat generated in the process chamber 110 (e.g., heat generated as the deposition tool 116 deposits a film layer on the surface of the workpiece 101 or as the etching tool etches the surface of the workpiece 101), measuring the surface temperature of the workpiece 101 along with the wavelength of light reflected by the workpiece 101 measured by the chromatic confocal sensor 140 may improve accuracy of the bow profile and stress profile measurements. The processor 150 may be further configured to filter the first scanning signal to produce the first filtered signal that further compensates for temperature variations of the workpiece 101 according to the first temperature signal. In some embodiments, the first filtered signal may compensate for vibrations of the robot arm 130 as the robot arm 130 moves the workpiece 101 from the transport chamber 120 to the process chamber 110 and temperature variations of the workpiece 101 according to the first temperature signal. For example, the processor 150 may normalize the first filtered signal according to the first temperature signal to compensate for temperature variations of the workpiece 101. In some embodiments, the temperature is compensated based on a pre-defined temperature vs. stress curve, such that temperature can be used to determine more accurate placement of the bow profile on the stress curve.

Similarly, the processor 150 may be further configured to receive a second temperature signal from the temperature sensor 145 based on the surface temperature of the workpiece 101 measured by the temperature sensor 145 as the robot arm 130 moves the workpiece 101 from the process chamber 110 to the transport chamber 120. The processor 150 may be further configured to filter the second scanning signal to produce the second filtered signal that further compensates for temperature variations of the workpiece 101 according to the second temperature signal. In some embodiments, the second filtered signal may compensate for vibrations of the robot arm 130 as the robot arm 130 moves the workpiece 101 from the process chamber 110 to the transport chamber 120 and temperature various of the workpiece according to the second temperature signal. For example, the processor 150 may normalize the second filtered signal according to the second temperature signal to compensate for temperature variations of the workpiece 101. Accordingly, the first bow profile and the second bow profile generated from the first filtered signal and the second filtered signal, respectively, may be congruently normalized such that the stress profile of the workpiece 101 may be more accurately determined using temperature signals to compensate for temperature variations in the workpiece 101.

In some embodiments, the processor may be configured to filter the first scanning signal to produce the first filtered signal and the second filtered signal that compensate for temperature variations of the workpiece 101 based on the first temperature signal and the second temperature signal using a CNN model. For example, the CNN model may be configured to output correction parameters, which, when applied to a polynomial fitting of the first scanning signal, may compensate for temperature variations of the workpiece 101 based on the first temperature signal and the second temperature signal. Accordingly, the first filtered signal and the second filtered signal may be normalized for more accurate measurement of the first bow profile and second bow profile and generation of the stress profile of the workpiece. In some embodiments, the CNN model may be a single model trained for both vibration compensation and temperature compensation.

Figure 4:
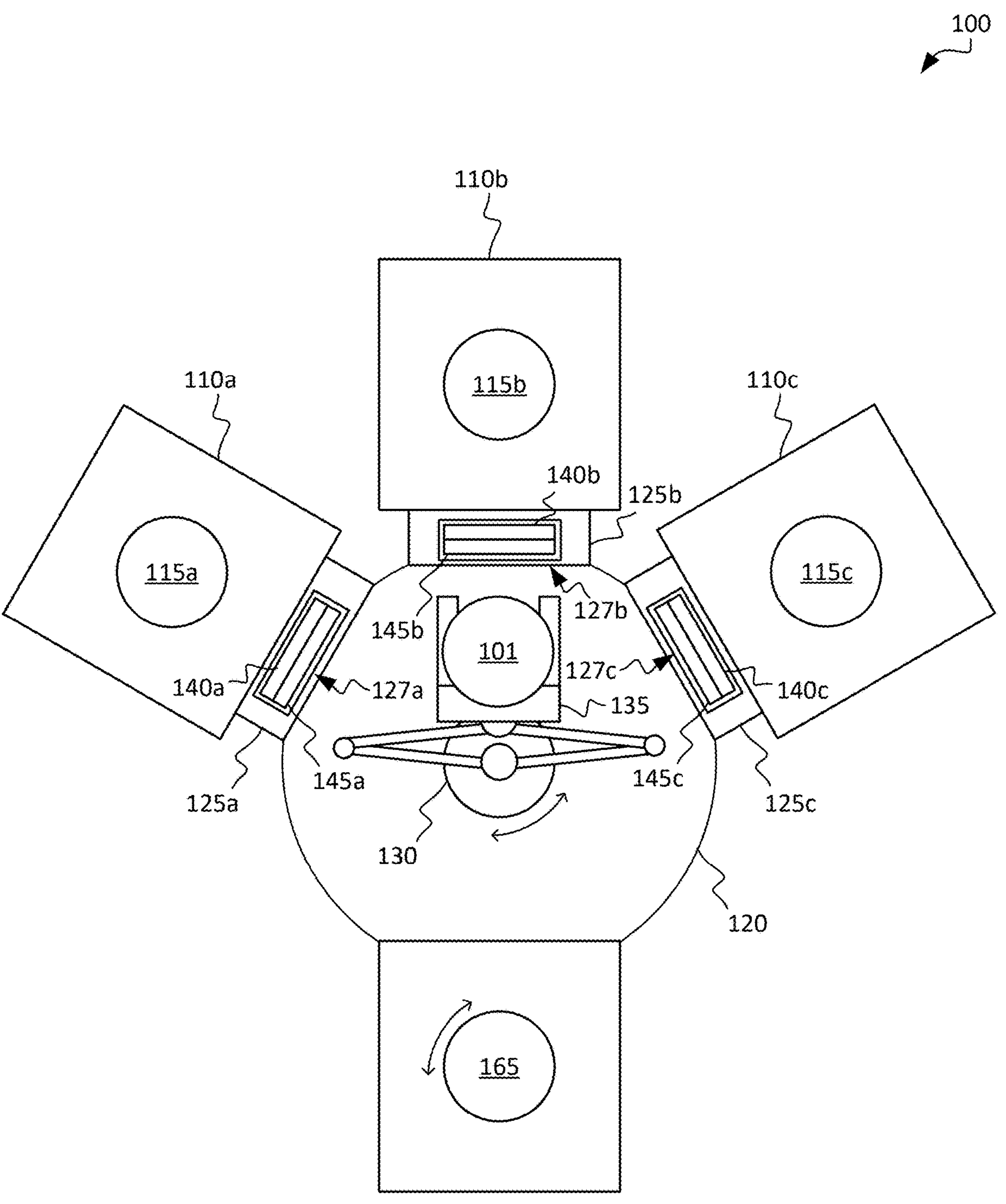
FIG. 4 is a top view of a system according to another embodiment of the present disclosure.
Figure 5:
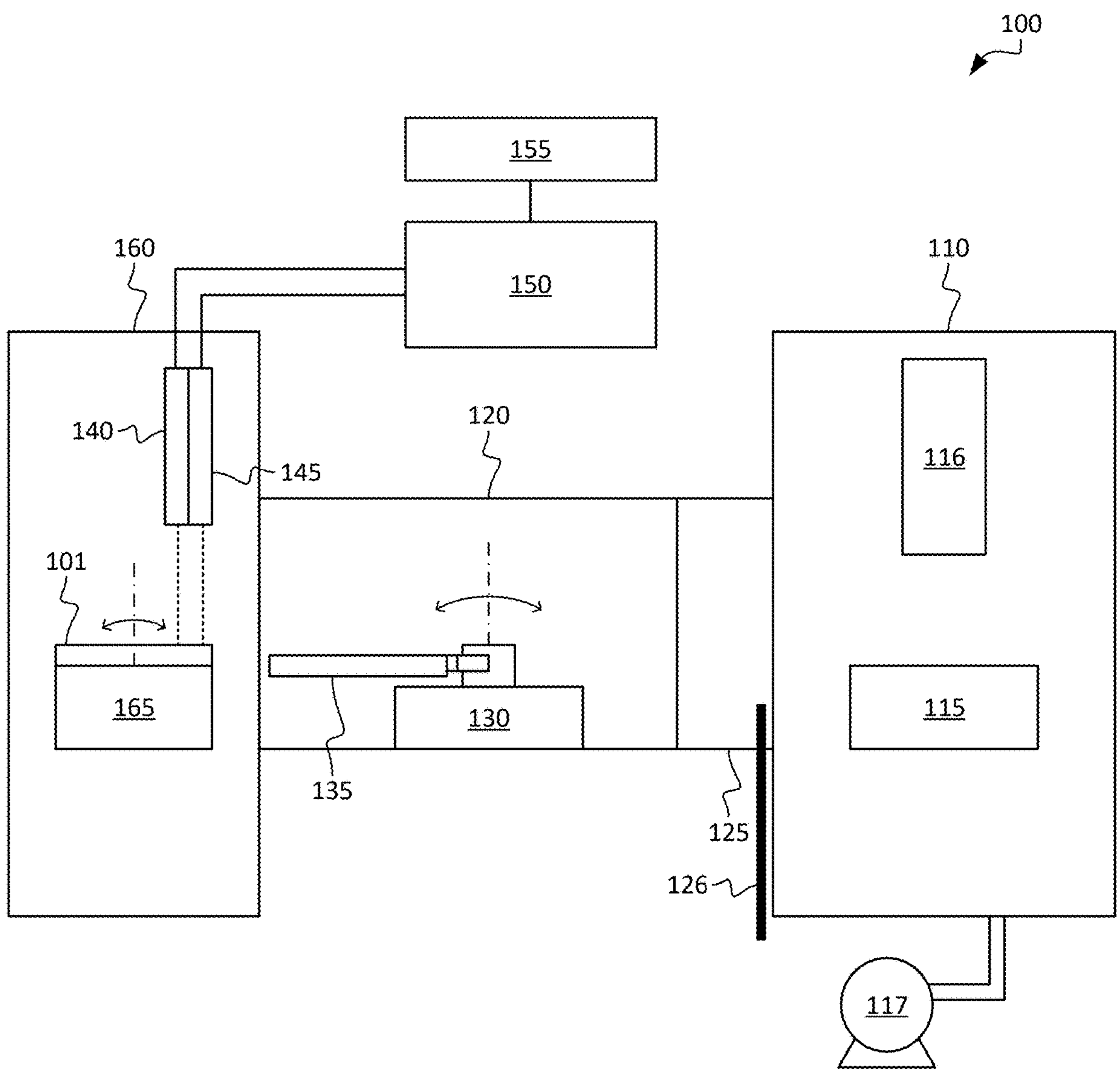
FIG. 5 is a side view of a system according to another embodiment of the present disclosure.

In some embodiments, the system 100 may comprise a plurality of process chambers 110. For example, as shown in FIG. 4, the system 100 may include a first process chamber 110*a*, a second process chamber 110*b*, a third process chamber 110*c*, and any additional number of process chambers 110. Each of the plurality of process chambers 110 may comprise a different type of tool (e.g., a deposition tool 116, an etching tool, or other type of tool) to perform different processes on the workpiece 101. The transport chamber 120 may be connected to each of the plurality of process chambers 110 by a respective slot valve 125. For example, the transport chamber 120 may be connected to the first process chamber 110*a* by a first slot valve 125*a*, the transport chamber 120 may be connected to the second process chamber 110*b* by a second slot valve 125*b*, and the transport chamber 120 may be connected to the third process chamber 110*c* by a third slot valve 125*c*. The robot arm 130 may be configured to move the workpiece 101 along a movement path between each of the plurality of process chambers 110 and the transport chamber 120 with the respective slot valve 125. In some embodiments, the plurality of process chambers 110 may be clustered around the transport chamber 120. The movement path of the robot arm 130 from the transport chamber 120 to each of the plurality of process chambers 110 may be in different radial directions relative to the transport chamber 120. Accordingly, the movement path of the robot arm 130 from the transport chamber to each of the plurality of process chambers 110 may be in a different radial direction relative to the transport chamber 120. The processor 150 may send instructions to the robot arm 130 to extend, retract, and rotate the robot arm 130 to align the end effector 135 with a respective one of the plurality of process chambers 110 to move the workpiece between one of the process chambers 110 and the transport chamber 120.

The system 100 may further comprise a plurality of chromatic confocal sensors 140. For example, the system 100 may include a first chromatic confocal sensor 140*a*, a second chromatic confocal sensor 140*b*, a third chromatic confocal sensor 140*c*, or any additional number of chromatic confocal sensors 140 corresponding to the number of process chambers 110. Each of the plurality of chromatic confocal sensors 140 may be configured to measure a wavelength of light reflected by the workpiece 101 as the robot arm 130 moves the workpiece 101 along the movement path between the plurality of process chambers 110 and the transport chamber 120. For example, the first chromatic confocal sensor 140*a* may be configured to emit polychromatic light through a first window 127*a* of the first slot valve 125*a*, the second chromatic confocal sensor 140*b* may be configured to emit polychromatic light through a second window 127*b* of the second slot valve 125*b*, and the third chromatic confocal sensor 140*c* may be configured to emit polychromatic light through a third window 127*c* of the third slot valve 125*c* to measure the wavelength of the light reflected by the surface of the workpiece 101 as the robot arm 130 moves the workpiece 101 along the movement path between each of the plurality of process chambers 110 and the transport chamber 120.

The processor 150 may be further configured to receive a plurality of first scanning signals from the plurality of the chromatic confocal sensors 140 based on the wavelength of the light reflected by the workpiece 101 as the robot arm 130 moves the workpiece 101 from the transport chamber 120 to each respective one of the plurality of process chambers 110. The processor 150 may be further configured to filter the plurality of first scanning signals to produce a plurality of first filtered signals that compensate for vibrations of the robot arm 130 while the robot arm 130 moves the workpiece 101 from the transport chamber 120 to the respective one of the plurality of process chambers 110. The processor 150 may be further configured to generate a plurality of first bow profiles of the workpiece 101 based on the plurality of first filtered signals.

The processor 150 may be further configured to receive a plurality of second scanning signals from the plurality of the chromatic confocal sensors 140 based on the wavelength of the light reflected by the workpiece 101 as the robot arm 130 moves the workpiece 101 from each respective one of the plurality of process chambers 110 to the transport chamber 120. The processor 150 may be further configured to filter the plurality of second scanning signals to produce a plurality of second filtered signals that compensate for vibrations of the robot arm 130 while the robot arm 130 moves the workpiece 101 from the respective one of the plurality of process chambers 110 to the transport chamber 120. The processor 150 may be further configured to generate a plurality of second bow profiles of the workpiece 101 based on the plurality of second filtered signals. The processor 150 may be configured to generate a plurality of stress profiles of the workpiece 101 based on the plurality of first bow profiles and the plurality of second bow profiles of the workpiece 101. Accordingly, the system 100 may be configured to monitor the stress of the workpiece 101 throughout the processing of the workpiece 101, as the robot arm 130 moves the workpiece 101 between the plurality of process chambers 110 to perform various fabrication, inspection, metrology, or review processes on the workpiece 101, with compensation for vibrations due to movement of the robot arm 130.

The system 100 may further comprise a plurality of temperature sensors 145. For example, the system 100 may include a first temperature sensor 145*a*, a second temperature sensor 145*b*, a third temperature sensor 145*c*, or any additional number of temperature sensors 145 corresponding to the number of process chambers 110. Each of the plurality of temperature sensors 145 may be configured to measure a surface temperature of the workpiece 101 as the robot arm 130 moves the workpiece 101 along the movement path between the plurality of process chambers 110 and the transport chamber 120. For example, the first temperature sensor 145*a* may be configured to emit infrared light through the first window 127*a* of the first slot valve 125*a*, the second temperature sensor 145*b* may be configured to emit infrared light through the second window 127*b* of the second slot valve 125*b*, and the third temperature sensor 145*c* may be configured to emit infrared light through the third window 127*c* of the third slot valve 125*c* to measure the surface temperature of the workpiece 101 as the robot arm 130 moves the workpiece 101 long the movement path between each of the plurality of process chambers 110 and the transport chamber 120.

The processor 150 may be further configured to receive a plurality of first temperature signals from the plurality of the temperature sensors 145 based on the surface temperature of the workpiece 101 measured by a respective one of the plurality of temperature sensors 145 as the robot arm 130 moves the workpiece 101 from the transport chamber 120 to each respective one of the plurality of process chambers 110. The processor 150 may be further configured to filter the plurality of first scanning signals to produce a plurality of first filtered signals that compensate for temperature variations of the workpiece 101 according to the plurality of first temperature signals. In some embodiments, the plurality of first filtered signals may compensate for vibrations of the robot arm 130 while the robot arm 130 moves the workpiece 101 from the transport chamber 120 to the respective one of the plurality of process chambers 110 and temperature variations of the workpiece 101 according to the plurality of first temperature signals. The processor 150 may be further configured to generate a plurality of first bow profiles of the workpiece 101 based on the plurality of first filtered signals.

The processor 150 may be further configured to receive a plurality of second temperature signals from the plurality of temperature sensors 145 based on the surface temperature of the workpiece 101 measured by a respective one of the plurality of temperature sensors 145 as the robot arm 130 moves the workpiece 101 from each respective one of the plurality of process chambers 110 to the transport chamber 120. The processor 150 may be further configured to filter the plurality of second scanning signals to produce a plurality of second filtered signals that compensate for temperature variations of the workpiece 101 according to the plurality of second temperature signals. In some embodiments, the plurality of second filtered signals may compensate for vibrations of the robot arm 130 while the robot arm 130 moves the workpiece 101 from the respective one of the plurality of process chambers 110 to the transport chamber 120 and temperature variations of the workpiece 101 based on the plurality of second temperature signals. The processor 150 may be further configured to generate a plurality of second bow profiles of the workpiece 101 based on the plurality of second filtered signals. The processor 150 may be configured to generate a plurality of stress profiles of the workpiece 101 based on the plurality of first bow profiles and the plurality of second bow profiles of the workpiece 101. Accordingly, the system 100 may be configured to monitor the stress of the workpiece 101 throughout the processing of the workpiece 101, as the robot arm 130 moves the workpiece 101 between the plurality of process chambers 110 to perform various fabrication, inspection, metrology, or review processes on the workpiece 101, with compensation for temperature variations of the workpiece 101 from differences in operating conditions of the transport chamber 120 and the plurality of process chambers 110.

In some embodiments, the chromatic confocal sensor 140 may be disposed in the EFEM 160. For example, the chromatic confocal sensor 140 may be configured to measure a wavelength of light reflected by the workpiece 101 with the workpiece 101 disposed on the rotary stage 165. The processor 150 may configured to receive a scanning signal from the chromatic confocal sensor 140 as the rotary stage 165 rotates the workpiece 101, and the processor 150 may be configured to generate a bow profile of the workpiece 101 based on the scanning signal. The processor 150 may be further configured to filter the scanning signal to compensate for vibrations caused by rotation of the rotary stage 165. Between each processing step, the robot arm 130 may transfer the workpiece 101 from the process chamber 110 to the EFEM 160 for measurement of the bow profile using the chromatic confocal sensor 140, which may be used to generate a stress profile of the workpiece 101.

In some embodiments, the temperature sensor 145 may be disposed in the EFEM. For example, the temperature sensor 145 may be configured to measure the surface temperature of the workpiece 101 with the workpiece 101 disposed on the rotary stage 165. The processor 150 may be configured to receive a temperature signal from the temperature sensor 145 as the rotary stage rotates the workpiece 101, and the processor 150 may be configured to filter the scanning signal based on the temperature signal to generate a bow profile of the workpiece, which may compensate for temperature variations of the workpiece 101. Between each processing step, the robot arm 130 may transfer the workpiece 101 from the process chamber 110 to the EFEM 160 for measurement of the surface temperature of the workpiece 101 along with the bow profile to more accurately generate the stress profile of the workpiece 101.

With the system 100, the chromatic confocal sensor 140 can be used for in-situ monitoring of the stress profile of the workpiece 101 between processing steps as the workpiece is moved by the robot arm 130 between the transport chamber 120 and the process chamber 110. By compensating for vibration of the moving robot arm 130 and/or temperature variations of the workpiece 101, the stress profile of the workpiece 101 can be more accurately determined and provide feedback on the basis of an individual workpiece 101, rather than batch feedback, without impacting throughput. This may allow stress shifts to be identified during the process, which can allow the process to be stopped and avoid scrapping a full lot and improve yield.

Figure 6:
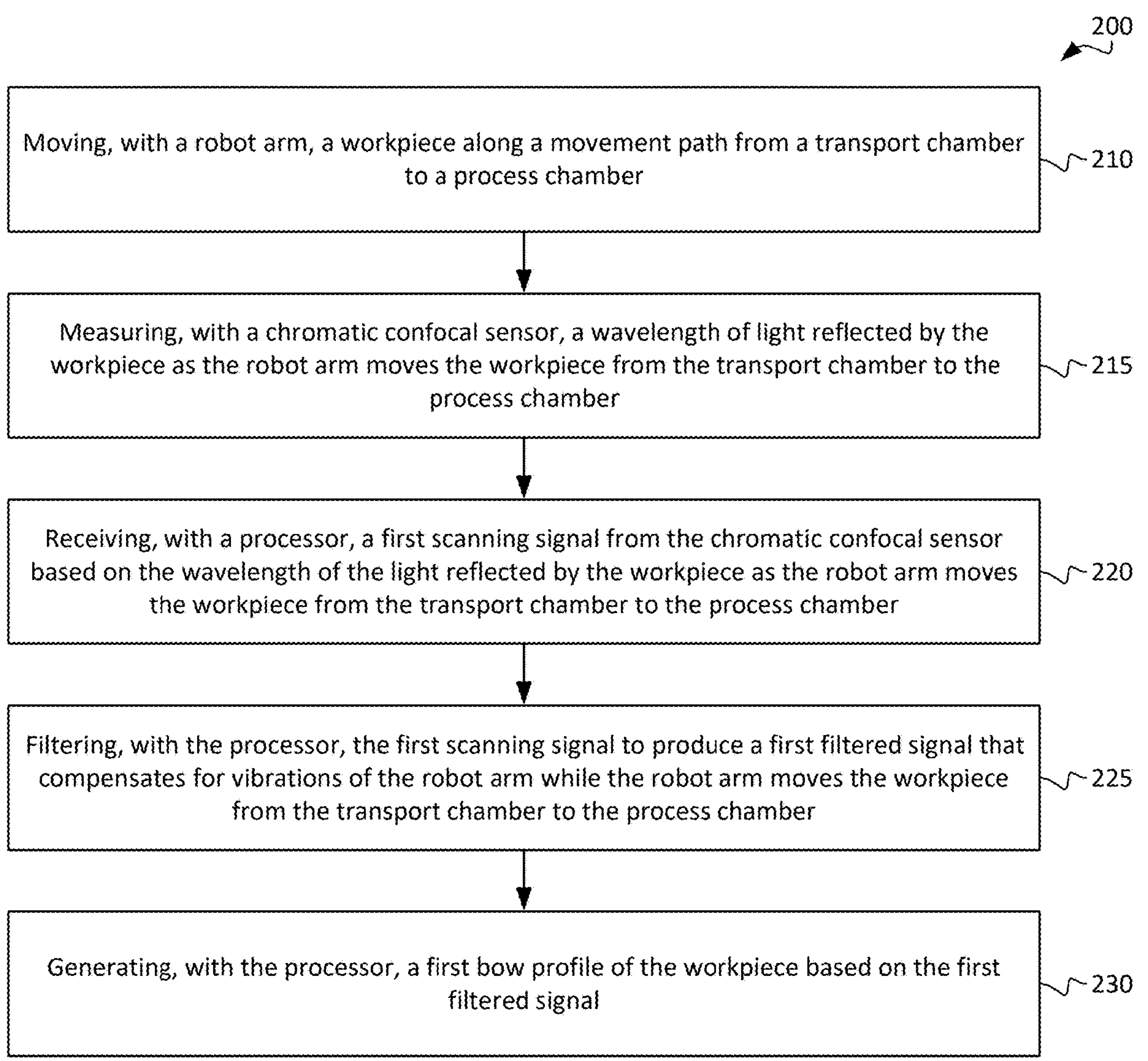
FIG. 6 is a flowchart of a method according to an embodiment of the present disclosure.

Another embodiment of the present disclosure provides a method 200. As shown in FIG. 6, the method 200 may comprise the following steps.

At step 210, a robot arm moves a workpiece along a movement path from a transport chamber to a process chamber. The transport chamber may be connected to the process chamber via a slot valve. The slot valve may be operable between an open position and a closed position. In the open portion, the transport chamber may be in fluid communication with the process chamber, and in the closed position, the process chamber may be sealed from the transport chamber. The slot valve may be in the open position as the robot arm moves the workpiece along the movement path.

At step 215, a chromatic confocal sensor measures a wavelength of light reflected by the workpiece as the robot arm moves the workpiece from the transport chamber to the process chamber. For example, the chromatic confocal sensor may emit polychromatic light across a surface of the workpiece as the robot arm moves the workpiece from the transport chamber to the process chamber and detect a wavelength of light reflected by the workpiece as the robot arm moves the workpiece from the transport chamber to the process chamber. The wavelength of the light reflected by the workpiece may correspond to a relative height of the workpiece, which may vary across the surface of the workpiece.

At step 220, a processor receives a first scanning signal from the chromatic confocal sensor based on the wavelength of the light reflected by the workpiece as the robot arm moves the workpiece from the transport chamber to the process chamber.

At step 225, the processor filters the first scanning signal to produce a first filtered signal that compensates for vibrations of the robot arm while the robot arm moves the workpiece from the transport chamber to the process chamber.

At step 230, the processor generates a first bow profile of the workpiece based on the first filtered signal.

Figure 7A:
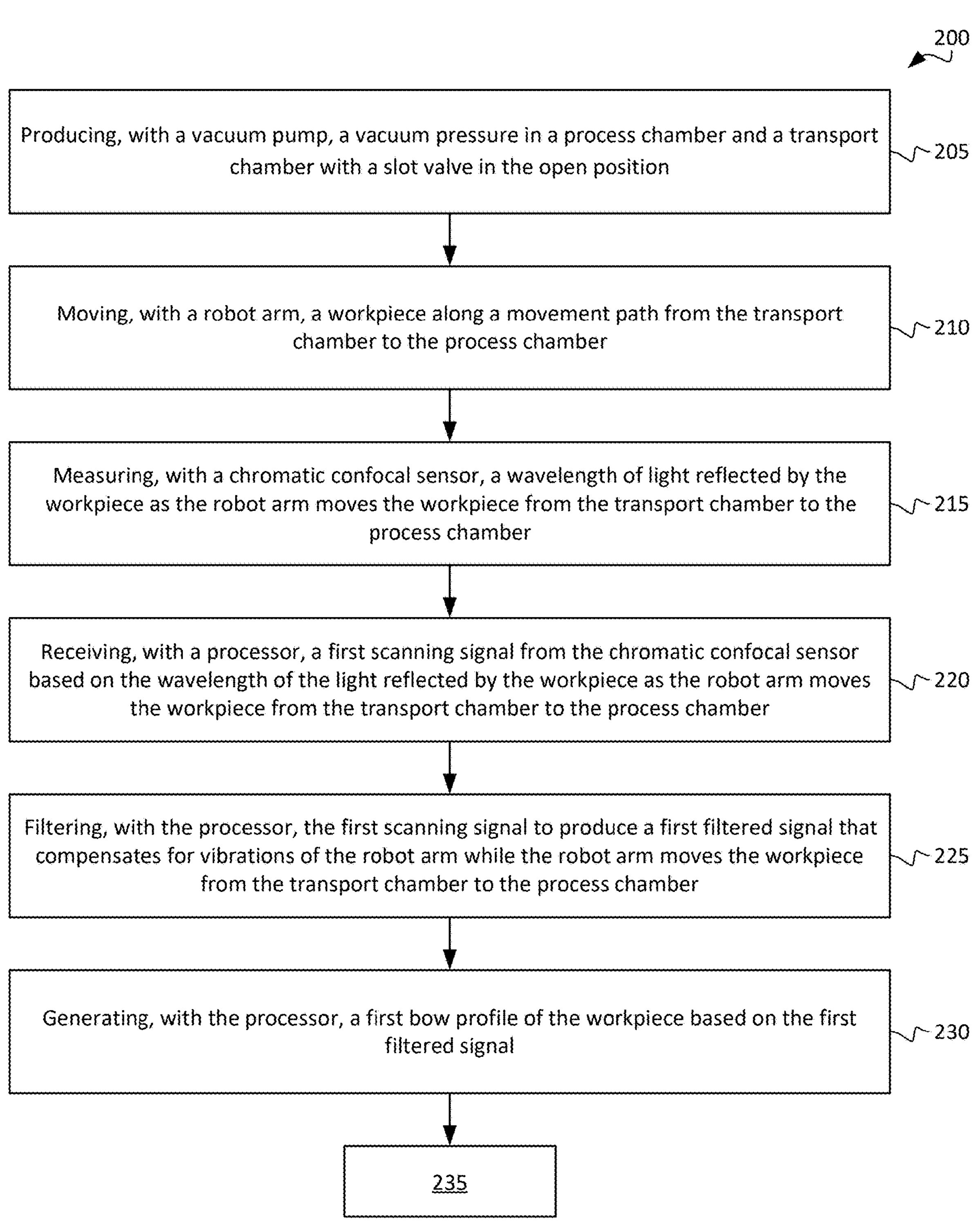
FIGS. 7A to 7C are flowcharts of a method according to another embodiment of the present disclosure.
Figure 7B:
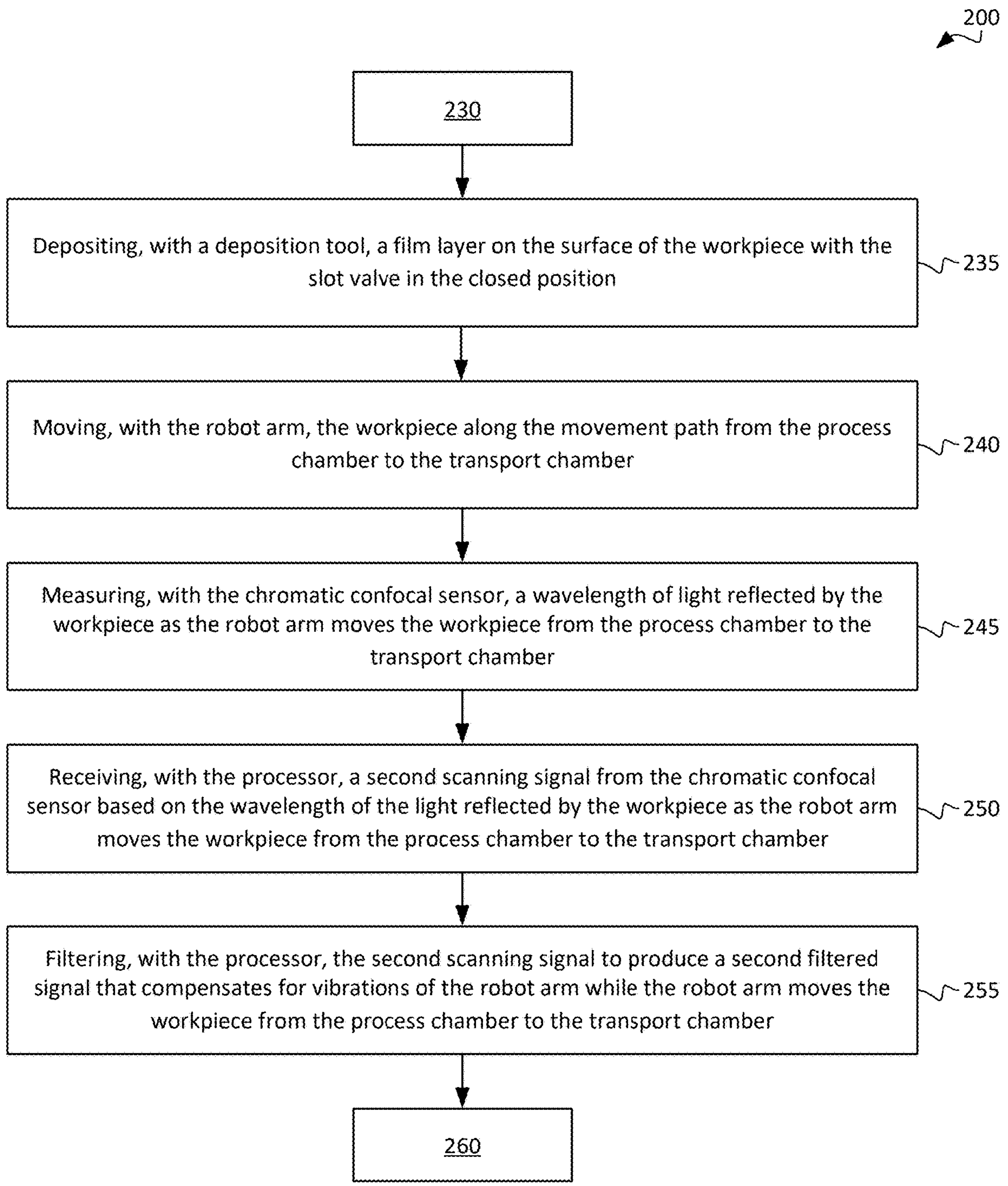
Figure 7C:
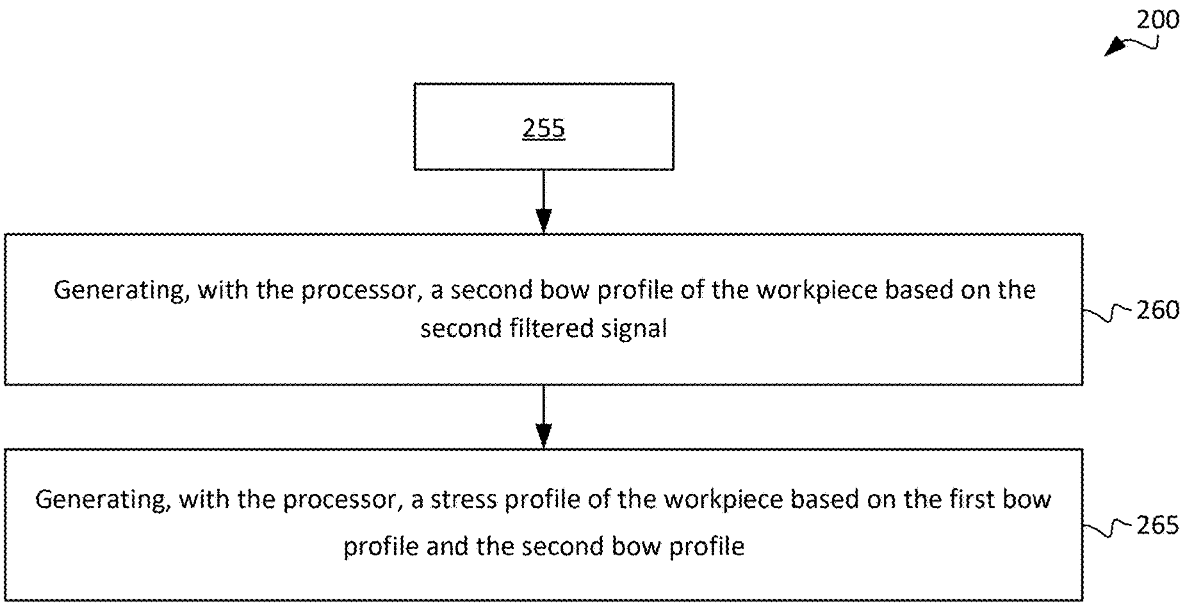

In some embodiments, the method 200 may further comprise the following steps, as shown in FIGS. 7A to 7C.

At step 240, the robot arm moves the workpiece along the movement path from the process chamber to the transport chamber.

At step 245, the chromatic confocal sensor measures a wavelength of light reflected by the workpiece as the robot arm moves the workpiece from the process chamber to the transport chamber. For example, the chromatic confocal sensor may emit polychromatic light across the surface of the workpiece as the robot arm moves the workpiece from the process chamber to the transport chamber and detect a wavelength of light reflected by the workpiece as the robot arm moves the workpiece from the process chamber to the transport chamber.

At step 250, the processor receives a second scanning signal from the chromatic confocal sensor based on the wavelength of the light reflected by the workpiece as the robot arm moves the workpiece from the process chamber to the transport chamber.

At step 255, the processor filters the second scanning signal to produce a second filtered signal that compensates for vibrations of the robot arm while the robot arm moves the workpiece from the process chamber to the transport chamber.

At step 260, the processor generates a second bow profile of the workpiece based on the second filtered signal.

At step 265, the processor generates a stress profile of the workpiece of the workpiece based on the first bow profile and the second bow profile.

In some embodiments, the method 200 may further comprise step 205, as shown in FIG. 7A. At step 205, a vacuum pump produces a vacuum pressure in the process chamber and the transport chamber with the slot valve in the open position. Step 205 may be performed prior to step 210. The vacuum pump may continuously produce the vacuum pressure in the process chamber throughout the method 200, including when the slot valve is moved to the closed position.

In some embodiments, the method 200 may further comprise step 235, as shown in FIG. 7B. At step 235, a deposition tool deposits a film layer on the surface of the workpiece with the slot valve in the closed position. The deposition tool may be disposed in the process chamber. Although step 235 is illustrated as being performed between step 230 and step 240, step 235 may be performed anywhere between step 210 and step 240, and may be simultaneous with any of steps 215 to 230. In other words, after the robot arm moves the workpiece from the transport chamber to the process chamber, the robot arm may dispose the workpiece on a chuck in the process chamber, and the deposition tool can deposit a film layer on the surface of the workpiece disposed on the chuck. After the deposition process, the robot arm can remove the workpiece from the chuck and move the workpiece from the process chamber to the transport chamber. In some embodiments, similar to the deposition tool, an etching tool may etch the surface of the workpiece with the slot valve in the closed position in a step similar to step 235.

Figure 8:
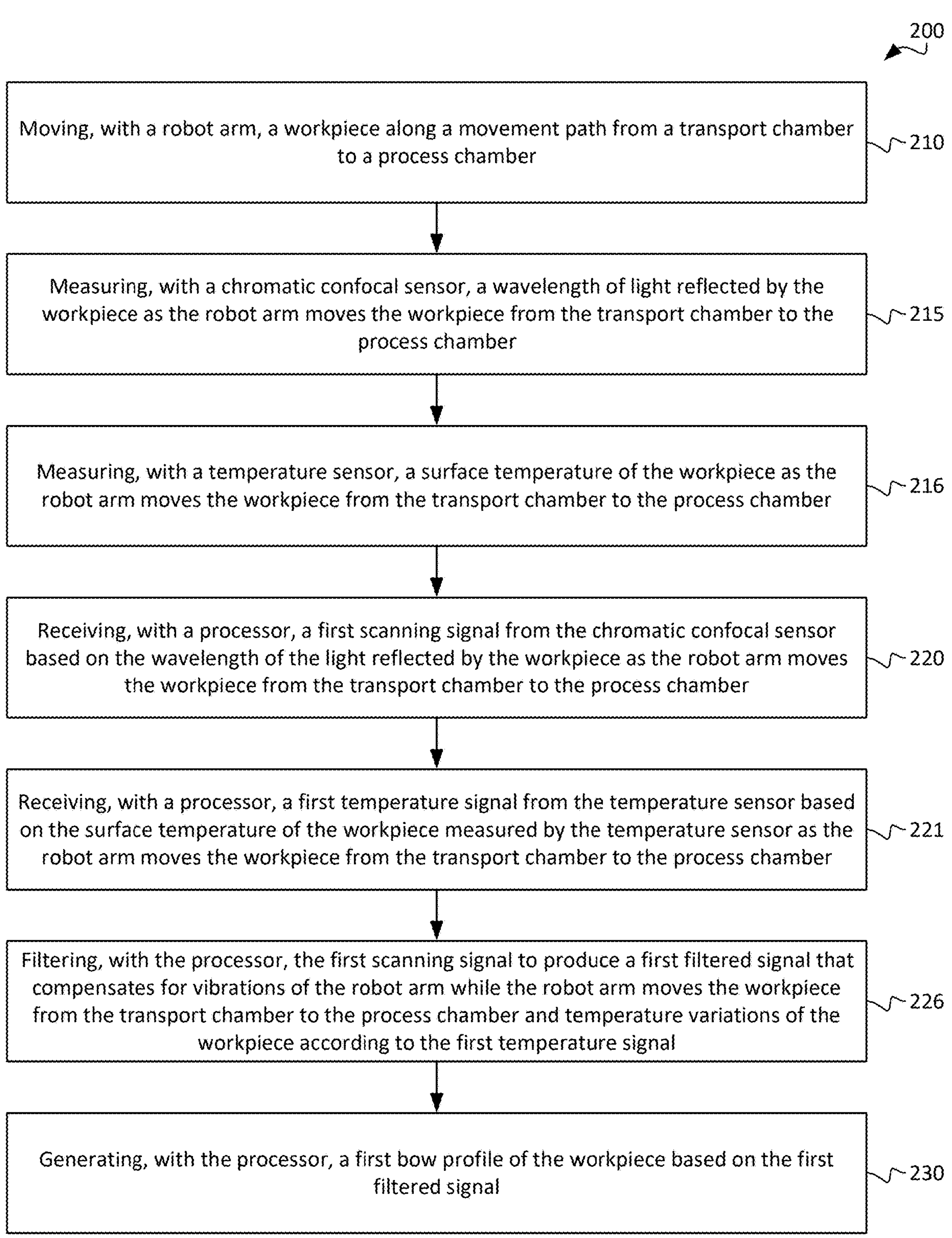
FIG. 8 is a flowchart of a method according to another embodiment of the present disclosure.

In some embodiments, the method 200 may further comprise the following steps, as shown in FIG. 8.

At step 216, a temperature sensor measures a surface temperature of the workpiece as the robot arm moves the workpiece from the transport chamber to the process chamber. Although step 216 is illustrated after step 215, step 216 may be performed simultaneously with, or prior to, step 215.

At step 221, the processor receives a first temperature signal from the temperature sensor based on the surface temperature of the workpiece measured by the temperature sensor as the robot arm moves the workpiece from the transport chamber to the process chamber. Although step 211 is illustrated after step 220, step 221 may be performed simultaneously with, or prior to, step 220.

In this embodiment, step 225 may comprise step 226. At step 226, the processor filters the first scanning signal to produce the first filtered signal that compensates for vibrations of the robot arm while the robot arm moves the workpiece from the transport chamber to the process chamber and temperature variations of the workpiece according to the first temperature signal.

With the method 200, the chromatic confocal sensor can be used for in-situ monitoring of the stress profile of the workpiece between processing steps as the workpiece is moved by the robot arm between the transport chamber and the process chamber. By compensating for vibration of the moving robot arm and/or temperature variations of the workpiece, the stress profile of the workpiece can be more accurately determined and provide feedback on the basis of an individual workpiece, rather than batch feedback, without impacting throughput. This may allow stress shifts to be identified during the process, which can allow the process to be stopped and avoid scrapping a full lot and improve yield.

Figure 9:
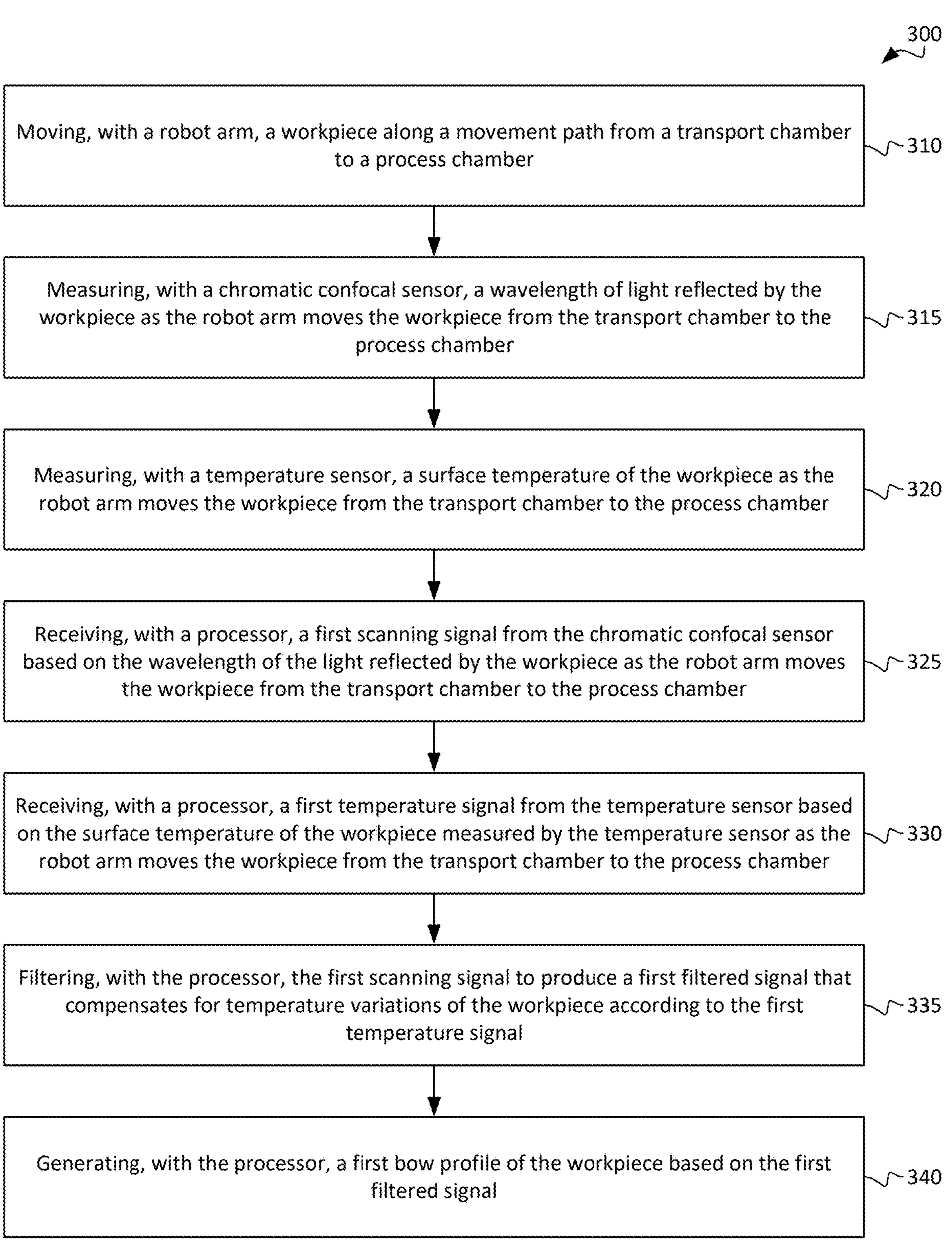
FIG. 9 is a flowchart of a method according to an embodiment of the present disclosure.

Another embodiment of the present disclosure provides a method 300. As shown in FIG. 9, the method 300 may comprise the following steps.

At step 310, a robot arm moves a workpiece along a movement path from a transport chamber to a process chamber. The transport chamber may be connected to the process chamber via a slot valve. The slot valve may be operable between an open position and a closed position. In the open portion, the transport chamber may be in fluid communication with the process chamber, and in the closed position, the process chamber may be sealed from the transport chamber. The slot valve may be in the open position as the robot arm moves the workpiece along the movement path.

At step 315, a chromatic confocal sensor measures a wavelength of light reflected by the workpiece as the robot arm moves the workpiece from the transport chamber to the process chamber. For example, the chromatic confocal sensor may emit polychromatic light across a surface of the workpiece as the robot arm moves the workpiece from the transport chamber to the process chamber and detect a wavelength of light reflected by the workpiece as the robot arm moves the workpiece from the transport chamber to the process chamber. The wavelength of the light reflected by the workpiece may correspond to a relative height of the workpiece, which may vary across the surface of the workpiece.

At step 320, a temperature sensor measures a surface temperature of the workpiece as the robot moves the workpiece from the transport chamber to the process chamber.

At step 325, a processor receives a first scanning signal from the chromatic confocal sensor based on the wavelength of the light reflected by the workpiece as the robot arm moves the workpiece from the transport chamber to the process chamber.

At step 330, the processor receives a first temperature signal from the temperature sensor based on the surface temperature of the workpiece measured by the temperature sensor as the robot arm moves the workpiece from the transport chamber to the process chamber.

At step 335, the processor filters the first scanning signal to produce a first filtered signal that compensates for temperature variations of the workpiece according to the first temperature signal.

At step 340, the processor generates a first bow profile of the workpiece based on the first filtered signal.

Figure 10A:
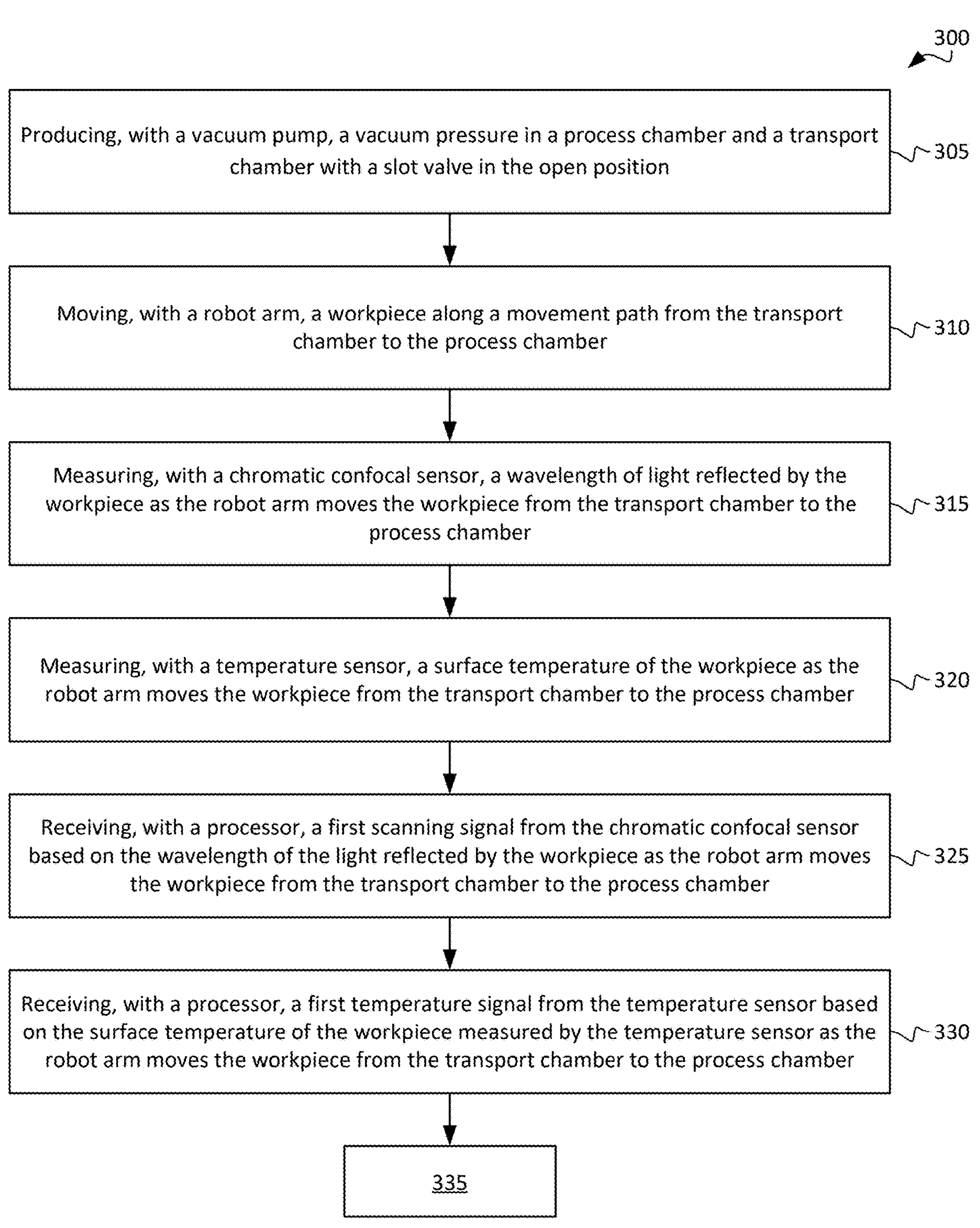
FIGS. 10A to 10C are flowcharts of a method according to another embodiment of the present disclosure.
Figure 10B:
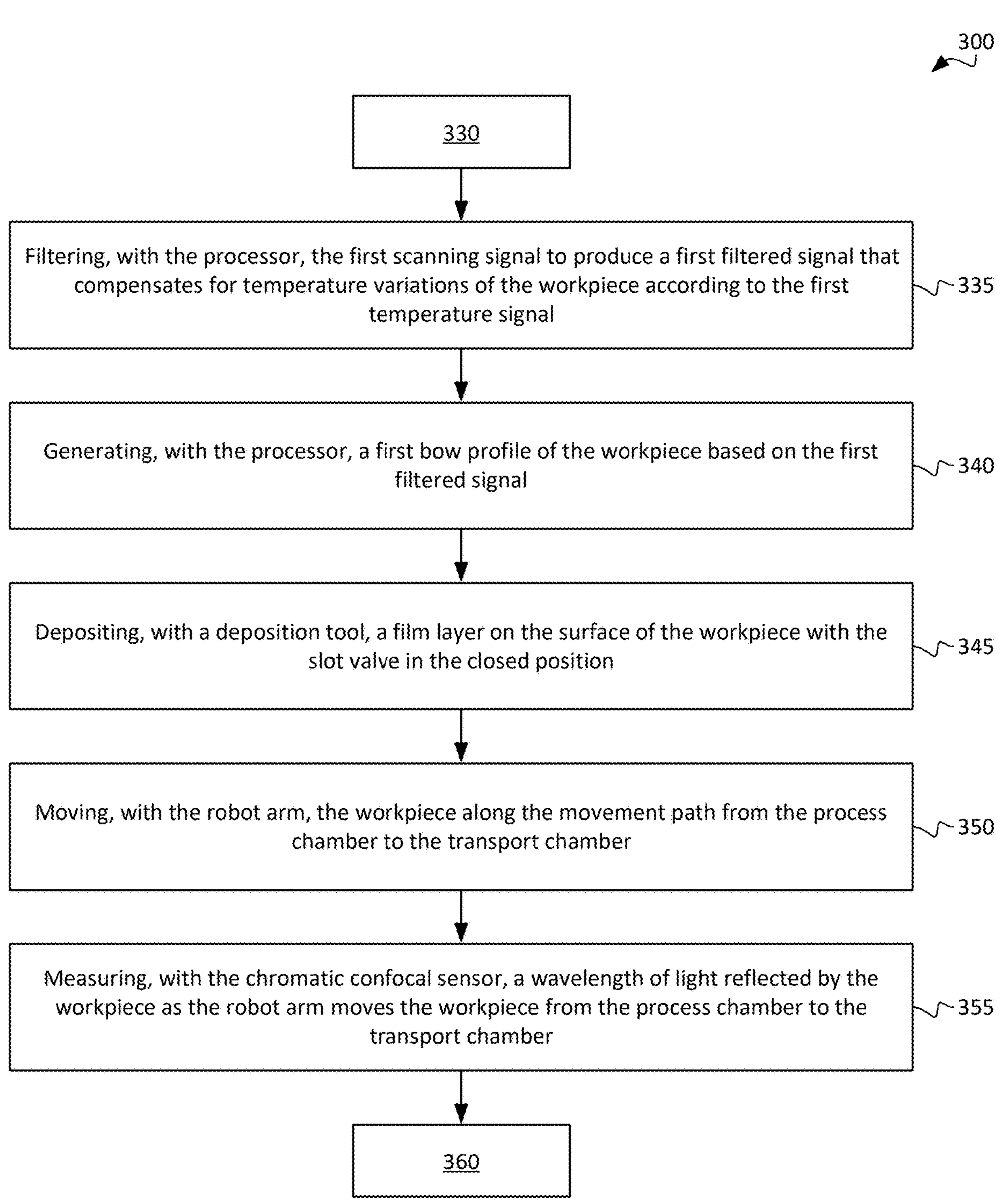
Figure 10C:
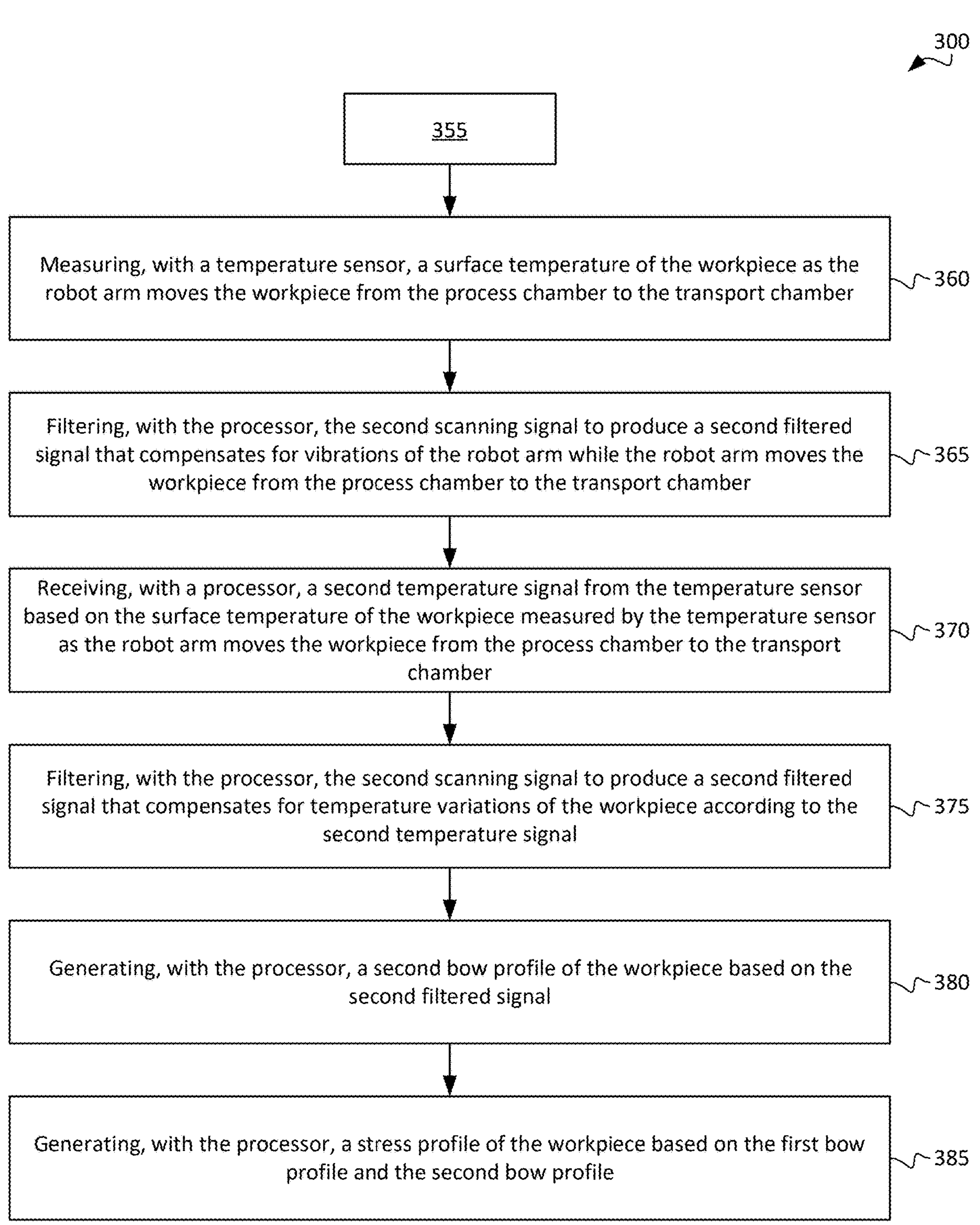

In some embodiments, the method 300 may further comprise the following steps, as shown in FIGS. 10A to 10C.

At step 350, the robot arm moves the workpiece along the movement path from the process chamber to the transport chamber.

At step 355, the chromatic confocal sensor measures a wavelength of light reflected by the workpiece as the robot arm moves the workpiece from the process chamber to the transport chamber. For example, the chromatic confocal sensor may emit polychromatic light across the surface of the workpiece as the robot arm moves the workpiece from the process chamber to the transport chamber and detect a wavelength of light reflected by the workpiece as the robot arm moves the workpiece from the process chamber to the transport chamber.

At step 360, the temperature sensor measures a surface temperature of the workpiece as the robot moves the workpiece from the process chamber to the transport chamber.

At step 365, the processor receives a second scanning signal from the chromatic confocal sensor based on the wavelength of the light reflected by the workpiece as the robot arm moves the workpiece from the process chamber to the transport chamber.

At step 370, the processor receives a second temperature signal from the temperature sensor based on the surface temperature of the workpiece measured by the temperature sensor as the robot arm moves the workpiece from the process chamber to the transport chamber.

At step 375, the processor filters the second scanning signal to produce a second filtered signal that compensates for temperature variations of the workpiece according to the second temperature signal.

At step 380, the processor generates a second bow profile of the workpiece based on the second filtered signal.

At step 385, the processor generates a stress profile of the workpiece of the workpiece based on the first bow profile and the second bow profile.

In some embodiments, the method 300 may further comprise step 305, as shown in FIG. 10A. At step 305, a vacuum pump produces a vacuum pressure in the process chamber and the transport chamber with the slot valve in the open position. Step 305 may be performed prior to step 310. The vacuum pump may continuously produce the vacuum pressure in the process chamber throughout the method 300, including when the slot valve is moved to the closed position.

In some embodiments, the method 300 may further comprise step 345, as shown in FIG. 10B. At step 345, a deposition tool deposits a film layer on the surface of the workpiece with the slot valve in the closed position. The deposition tool may be disposed in the process chamber. Although step 345 is illustrated as being performed between step 340 and step 350, step 345 may be performed anywhere between step 310 and step 350, and may be simultaneous with any of steps 315 to 340. In other words, after the robot arm moves the workpiece from the transport chamber to the process chamber, the robot arm may dispose the workpiece on a chuck in the process chamber, and the deposition tool can deposit a film layer on the surface of the workpiece disposed on the chuck. After the deposition process, the robot arm can remove the workpiece from the chuck and move the workpiece from the process chamber to the transport chamber. In some embodiments, similar to the deposition tool, an etching tool may etch the surface of the workpiece with the slot valve in the closed position in a step similar to step 345.

With the method 300, the chromatic confocal sensor can be used for in-situ monitoring of the stress profile of the workpiece between processing steps as the workpiece is moved by the robot arm between the transport chamber and the process chamber. By compensating for temperature variations of the workpiece, the stress profile of the workpiece can be more accurately determined and provide feedback on the basis of an individual workpiece, rather than batch feedback, without impacting throughput. This may allow stress shifts to be identified during the process, which can allow the process to be stopped and avoid scrapping a full lot and improve yield.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:

a process chamber;

a transport chamber connected to the process chamber via a slot valve, wherein the slot valve is operable between an open position, in which the transport chamber is in fluid communication with the process chamber, and a closed position, in which the process chamber is sealed from the transport chamber;

a robot arm configured to support a workpiece and move the workpiece along a movement path between the process chamber and the transport chamber with the slot valve in the open position;

a chromatic confocal sensor configured to measure a wavelength of light reflected by the workpiece as the robot arm moves the workpiece along the movement path;

a temperature sensor configured to measure a surface temperature of the workpiece as the robot arm moves the workpiece along the movement path between the process chamber and the transport chamber; and a processor in electronic communication with the chromatic confocal sensor and the temperature sensor, wherein the processor is configured to:

receive a first scanning signal from the chromatic confocal sensor based on the wavelength of the light reflected by the workpiece as the robot arm moves the workpiece from the transport chamber to the process chamber;

receive a first temperature signal from the temperature sensor based on the surface temperature of the workpiece measured by the temperature sensor as the robot arm moves the workpiece from the transport chamber to the process chamber;

filter the first scanning signal to produce a first filtered signal that compensates for temperature variations of the workpiece according to the first temperature signal; and generate a first bow profile of the workpiece based on the first filtered signal.

2. The system of claim 1, wherein the processor is further configured to:

receive a second scanning signal from the chromatic confocal sensor based on the wavelength of the light reflected by the workpiece as the robot arm moves the workpiece from the process chamber to the transport chamber;

receive a second temperature signal from the temperature sensor based on the surface temperature of the workpiece measured by the temperature sensor as the robot arm moves the workpiece from the process chamber to the transport chamber;

filter the second scanning signal to produce a second filtered signal that compensates for temperature variations of the workpiece according to the second temperature signal;

generate a second bow profile of the workpiece based on the second filtered signal; and generate a stress profile of the workpiece based on the first bow profile and the second bow profile.

3. The system of claim 1, wherein the chromatic confocal sensor is configured to emit polychromatic light across a surface of the workpiece as the robot arm moves the workpiece along the movement path and detect the wavelength of the light reflected by the workpiece.

4. The system of claim 3, wherein the chromatic confocal sensor is disposed outside of the slot valve at atmospheric pressure and is configured to emit the polychromatic light through a window of the slot valve across the surface of the workpiece as the robot arm moves the workpiece along the movement path.

5. The system of claim 1, further comprising:

a vacuum pump in fluid communication with the process chamber and the transport chamber, wherein the vacuum pump is configured to produce a vacuum pressure in the process chamber and the transport chamber.

6. The system of claim 1, further comprising:

a chuck disposed in the process chamber, wherein the robot arm is configured to removably dispose the workpiece on the chuck; and a deposition tool disposed in the process chamber, wherein the deposition tool is configured to deposit a film layer on a surface of the workpiece disposed on the chuck with the slot valve in the closed position.

7. The system of claim 1, further comprising:

a plurality of process chambers, wherein the transport chamber is connected to each of the plurality of process chambers by a respective slot valve, and the robot arm is configured to move the workpiece along a movement path between each of the plurality of process chambers and the transport chamber with the respective slot valve in the open position;

a plurality of chromatic confocal sensors, wherein each of the plurality of chromatic confocal sensors is configured to measure a wavelength of light reflected by the workpiece as the robot arm moves the workpiece along the movement path between the plurality of process chambers and the transport chamber; and a plurality of temperature sensors, wherein each of the plurality of temperature sensors is configured to measure a surface temperature of the workpiece as the robot arm moves the workpiece along the movement path between the plurality of process chambers and the transport chamber;

wherein the processor is further configured to:

receive a plurality of first scanning signals from the plurality of chromatic confocal sensors based on the wavelength of the light reflected by the workpiece as the robot arm moves the workpiece from the transport chamber to each respective one of the plurality of process chambers;

receive a plurality of first temperature signals from the plurality of temperature sensors based on the surface temperature of the workpiece measured by each of the plurality of temperature sensors as the robot arm moves the workpiece from the transport chamber to each respective one of the plurality of process chambers;

filter the plurality of first scanning signals to produce a plurality of first filtered signals that compensate for temperature variations of the workpiece according to the respective one of the plurality of first temperature signals; and generate a plurality of first bow profiles of the workpiece based on the plurality of first filtered signals.

8. The system of claim 7, wherein the plurality of process chambers are clustered around the transport chamber, and the movement path of the robot arm from the transport chamber to each of the plurality of process chambers is in a different radial direction relative to the transport chamber.

9. The system of claim 8, wherein the temperature sensor is a pyrometer configured to emit infrared light across a surface of the workpiece as the robot arm moves the workpiece along the movement path and detect an intensity of the light reflected by the workpiece to measure the surface temperature of the workpiece.

10. The system of claim 9, wherein the pyrometer is disposed outside of the slot valve at atmospheric pressure and is configured to emit the infrared light through a window of the slot valve across the surface of the workpiece as the robot arm moves the workpiece along the movement path.

11. The system of claim 1, further comprising:

an equipment front end module (EFEM) connected to the transport chamber; and a rotary stage disposed within the EFEM, wherein the robot arm is configured to removably dispose the workpiece on the rotary stage, and the rotary stage is configured to rotate the workpiece to a different rotary alignment with the workpiece disposed on the rotary stage;

wherein the robot arm is further configured to move the workpiece along the movement path between the process chamber and the transport chamber from the EFEM, with a rotary alignment of the workpiece being set by the rotary stage.

12. The system of claim 11, wherein the processor is further configured to generate the first bow profile of the workpiece based on the first scanning signal received from the chromatic confocal sensor based on the light reflected by the workpiece in each different rotary alignment.

13. The system of claim 1, wherein the chromatic confocal sensor is configured to emit polychromatic light in a line across a surface of the workpiece as the robot arm moves the workpiece along the movement path, a width of the line being greater than or equal to a width of the workpiece.

14. The system of claim 1, further comprising:

an electronic data storage unit in electronic communication with the processor, wherein a convolutional neural network (CNN) model is stored on the electronic data storage unit, and the processor is configured to filter the first scanning signal to produce the first filtered signal that compensates for temperature variations of the workpiece according to the first temperature signal using the CNN model.

15. The system of claim 14, wherein the CNN model is configured to output correction parameters, which, when applied to a polynomial fitting of the first scanning signal, compensate for temperature variations of the workpiece according to the first temperature signal to produce the first filtered signal.

16. A method comprising:

moving, with a robot arm, a workpiece along a movement path from a transport chamber to a process chamber, wherein the transport chamber is connected to the process chamber via a slot valve, the slot valve being operable between an open position, in which the transport chamber is in fluid communication with the process chamber, and a closed position, in which the process chamber is sealed from the transport chamber, and the slot valve being in the open position as the robot arm moves the workpiece along the movement path;

measuring, with a chromatic confocal sensor, a wavelength of light reflected by the workpiece as the robot arm moves the workpiece from the transport chamber to the process chamber;

measuring, with a temperature sensor, a surface temperature of the workpiece as the robot arm moves the workpiece from the transport chamber to the process chamber;

receiving, with a processor, a first scanning signal from the chromatic confocal sensor based on the wavelength of the light reflected by the workpiece as the robot arm moves the workpiece from the transport chamber to the process chamber;

receiving, with the processor, a first temperature signal from the temperature sensor based on the surface temperature of the workpiece measured by the temperature sensor as the robot arm moves the workpiece from the transport chamber to the process chamber;

filtering, with the processor, the first scanning signal to produce a first filtered signal that compensates for temperature variations of the workpiece according to the first temperature signal; and generating, with the processor, a first bow profile of the workpiece based on the first filtered signal.

17. The method of claim 16, further comprising:

moving, with the robot arm, the workpiece along the movement path from the process chamber to the transport chamber;

measuring, with the chromatic confocal sensor, a wavelength of light reflected by the workpiece as the robot arm moves the workpiece from the process chamber to the transport chamber;

measuring, with the temperature sensor, a surface temperature of the workpiece as the robot arm moves the workpiece from the process chamber to the transport chamber;

receiving, with the processor, a second scanning signal from the chromatic confocal sensor based on the wavelength of the light reflected by the workpiece as the robot arm moves the workpiece from the process chamber to the transport chamber;

receiving, with the processor, a second temperature signal from the temperature sensor based on the surface temperature of the workpiece measured by the temperature sensor as the robot arm moves the workpiece from the process chamber to the transport chamber;

filtering, with the processor, the second scanning signal to produce a second filtered signal that compensates for temperature variations of the workpiece according to the second temperature signal;

generating, with the processor, a second bow profile of the workpiece based on the second filtered signal; and generating, with the processor, a stress profile of the workpiece based on the first bow profile and the second bow profile.

18. The method of claim 16, further comprising:

producing, with a vacuum pump, a vacuum pressure in the process chamber and the transport chamber with the slot valve in the open position; and depositing, with a deposition tool, a film layer on a surface of the workpiece with the slot valve in the closed position, wherein the deposition tool is disposed in the process chamber.

* * * * *